(12) United States Patent
Li

(10) Patent No.: US 11,882,737 B2
(45) Date of Patent: Jan. 23, 2024

(54) ARRAY SUBSTRATE INCLUDING SWITCH ELEMENT THAT INCLUDES CONTROL PORTION AND SEMICONDUCTOR PORTION, AND DISPLAY PANEL AND DISPLAY DEVICE INCLUDING THE SAME

(71) Applicant: Xiamen Tianma Micro-Electronics Co., Ltd., Xiamen (CN)

(72) Inventor: Lei Li, Wuhan (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 279 days.

(21) Appl. No.: 17/357,638

(22) Filed: Jun. 24, 2021

(65) Prior Publication Data

US 2022/0328596 A1 Oct. 13, 2022

(30) Foreign Application Priority Data

Apr. 13, 2021 (CN) .......................... 202110391717.3

(51) Int. Cl.
| | |
|---|---|
| *H01L 29/08* | (2006.01) |
| *H10K 59/131* | (2023.01) |
| *G09G 3/3275* | (2016.01) |
| *H10K 59/121* | (2023.01) |

(52) U.S. Cl.
CPC ......... *H10K 59/131* (2023.02); *G09G 3/3275* (2013.01); *H10K 59/1213* (2023.02)

(58) Field of Classification Search
CPC . H10K 59/131; H10K 59/1213; G09G 3/3275

USPC .......................................................... 257/40
See application file for complete search history.

(56) References Cited

U.S. PATENT DOCUMENTS

| 2015/0243720 A1* | 8/2015 | Kwon | ................. | H01L 27/1251 |
|---|---|---|---|---|
| | | | | 257/40 |
| 2018/0197907 A1* | 7/2018 | Wada | .................... | H04N 25/617 |
| 2019/0104270 A1* | 4/2019 | Sakurai | .................. | H04N 25/75 |

FOREIGN PATENT DOCUMENTS

| CN | 110335564 A | 10/2019 |
|---|---|---|
| CN | 111682054 A | 9/2020 |
| CN | 111697040 A | 9/2020 |

\* cited by examiner

*Primary Examiner* — Phuc T Dang
(74) *Attorney, Agent, or Firm* — Anova Law Group, PLLC

(57) ABSTRACT

An array substrate, a display panel and a display device are provided. The array substrate includes a plurality of pixel circuits arranged in an array in a first direction and a second direction, where each pixel circuit includes a first semiconductor portion including a first node and a second node; a first reference signal line and a second reference signal line electrically connected to the first node and the second node, respectively; and a switch element formed by a second semiconductor portion and a control portion. In adjacent two pixel circuits in the second direction, the first node of one pixel circuit is connected to the second node of the other one pixel circuit through the second semiconductor portion. The control portion has an orthographic projection on a plane of the array substrate at least partially overlapping the second semiconductor portion.

20 Claims, 20 Drawing Sheets

10

ARRAY SUBSTRATE INCLUDING SWITCH ELEMENT THAT INCLUDES CONTROL PORTION AND SEMICONDUCTOR PORTION, AND DISPLAY PANEL AND DISPLAY DEVICE INCLUDING THE SAME

CROSS-REFERENCE TO RELATED APPLICATION

This application claims the priority of Chinese patent application No. 202110391717.3, filed on Apr. 13, 2021, the entirety of which is incorporated herein by reference.

FIELD

The present disclosure generally relates to the field of display technology and, more particularly, relates to an array substrate, a display panel and a display device.

BACKGROUND

Organic light-emitting diode (OLED) is one of hot spots in the field of display research. Compared with a liquid crystal display (LCD), OLED display is featured with advantages such as low energy consumption, low production cost, self-luminous, wide viewing angle, and fast response speed, etc. OLED array substrates have begun to replace conventional LCD array substrates in the display field such as mobile phone, PDA, and digital camera, etc.

A pixel circuit is provided in the OLED array substrate to drive the OLED light-emitting elements. If the characteristics of the pixel circuits are inconsistent, the display uniformity may be affected.

SUMMARY

One aspect of the present disclosure provides an array substrate. The array substrate includes a plurality of pixel circuits arranged in an array in a first direction and a second direction that intersect each other. Each pixel circuit of the plurality of pixel circuits includes a first semiconductor portion, and the first semiconductor portion includes a first node and a second node. The array substrate also includes a first reference signal line extended along the first direction and electrically connected to the first node, and a second reference signal line extended along the first direction and electrically connected to the second node. Moreover, the array substrate includes a second semiconductor portion and a control portion. In adjacent two pixel circuits in the second direction of the plurality of pixel circuits, the first node of one pixel circuit is connected to the second node of the other one pixel circuit through the second semiconductor portion. An orthographic projection of the control portion on a plane of the array substrate at least partially overlaps an orthographic projection of the second semiconductor portion on the plane of the array substrate, and the control portion and the second semiconductor portion form a switch element.

Another aspect of the present disclosure provides a display panel. The display panel includes an array substrate. The array substrate includes a plurality of pixel circuits arranged in an array in a first direction and a second direction that intersect each other. Each pixel circuit of the plurality of pixel circuits includes a first semiconductor portion, and the first semiconductor portion includes a first node and a second node. The array substrate also includes a first reference signal line extended along the first direction and electrically connected to the first node, and a second reference signal line extended along the first direction and electrically connected to the second node. Moreover, the array substrate includes a second semiconductor portion and a control portion. In adjacent two pixel circuits in the second direction of the plurality of pixel circuits, the first node of one pixel circuit is connected to the second node of the other one pixel circuit through the second semiconductor portion. An orthographic projection of the control portion on a plane of the array substrate at least partially overlaps an orthographic projection of the second semiconductor portion on the plane of the array substrate, and the control portion and the second semiconductor portion form a switch element.

Another aspect of the present disclosure provides a display device. The display device includes a display panel including an array substrate. The array substrate includes a plurality of pixel circuits arranged in an array in a first direction and a second direction that intersect each other. Each pixel circuit of the plurality of pixel circuits includes a first semiconductor portion, and the first semiconductor portion includes a first node and a second node. The array substrate also includes a first reference signal line extended along the first direction and electrically connected to the first node, and a second reference signal line extended along the first direction and electrically connected to the second node. Moreover, the array substrate includes a second semiconductor portion and a control portion. In adjacent two pixel circuits in the second direction of the plurality of pixel circuits, the first node of one pixel circuit is connected to the second node of the other one pixel circuit through the second semiconductor portion. An orthographic projection of the control portion on a plane of the array substrate at least partially overlaps an orthographic projection of the second semiconductor portion on the plane of the array substrate, and the control portion and the second semiconductor portion form a switch element.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

It should be noted that the relational terms such as "first" and "second" are merely used to distinguish one entity or operation from another entity or operation, and do not necessarily require or imply any such actual relationship or sequence between these entities or operations.

It should be understood that when describing the structure of a component, when a layer or a region is referred to as being "on" or "above" another layer or another region, the layer or the region may be directly on the other layer or the other region, or other layers or regions may be contained between the layer or the region and the another layer or the another region. Further, when a component is turned over, the layer or the region may be "under" or "below" the another layer or the another region.

Figure 1:
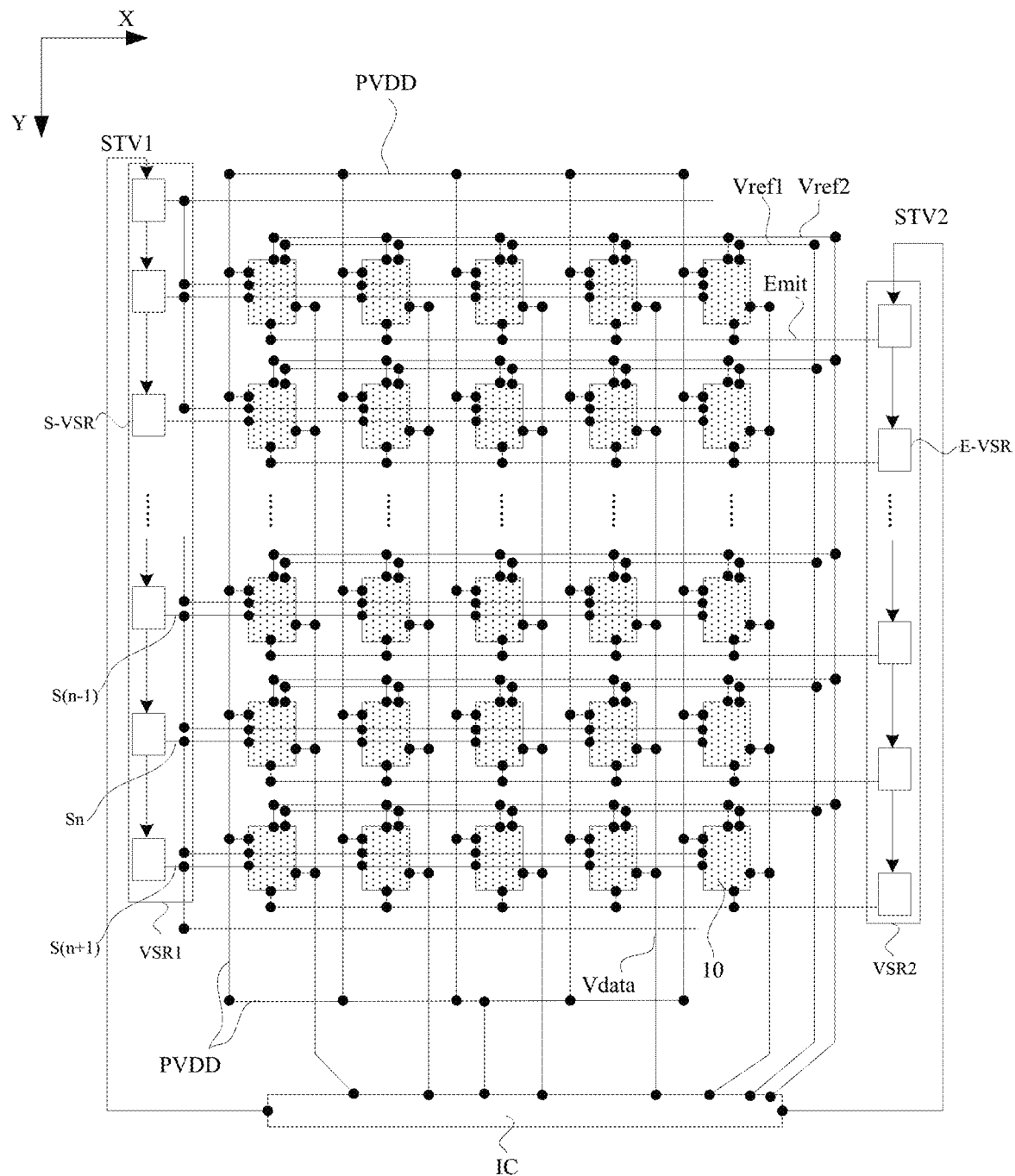
FIG. 1 illustrates a schematic top view of an exemplary array substrate consistent with disclosed embodiments of the present disclosure.

The present disclosure provides an array substrate. Referring to FIG. 1, the array substrate 100 may include a plurality of pixel circuits 10 arranged in an array. For example, the plurality of pixel circuits 10 may be arranged in an array in a first direction X and a second direction Y that intersect each other. In one embodiment, the first direction X may be a row direction, and the second direction Y may be a column direction. In another embodiment, the first direction X may be a column direction, and the second direction Y may be a row direction.

In one embodiment, the array substrate 100 may further include a driving chip IC, a first gate driving circuit VSR1, a second gate driving circuit VSR2, a power signal line PVDD, a data signal line Vdata, a first reference signal line Vref1, a second reference signal line Vref2, scanning signal lines S(n−1), Sn, S(n+1), and a light-emitting control signal line Emit.

The first gate driving circuit VSR1 may include a plurality of cascaded shift registers S-VSR, and each shift register S-VSR may be connected to the pixel circuit 10 through a scanning signal line. The first gate driving circuit VSR1 may be configured to provide a scanning signal to the pixel circuit 10. The driving chip IC may provide a first start signal STV1 to the first gate driving circuit VSR1. In addition, as shown in FIG. 1, except for the first-level and last-level shift registers S-VSR, each of the remaining shift registers S-VSR of the plurality of cascaded shift registers S-VSR may provide scanning signals to the pixel circuits 10 in adjacent two rows. In view of this, two rows of dummy pixel circuits (not shown in FIG. 1) may be disposed on the array substrate, which may be connected to the scanning line corresponding to the first-level shift register S-VSR and the scanning line corresponding to the last-level shift register S-VSR, respectively, while the dummy pixel circuit may not be used for display.

The second gate driving circuit VSR2 may include a plurality of cascaded shift registers E-VSR, and each shift register E-VSR may be connected to the pixel circuit 10 through the light-emitting control signal line Emit. The second gate driving circuit VSR2 may be configured to provide a light-emitting control signal to the pixel circuit 10. The driving chip IC may provide a second start signal STV2 to the second gate driving circuit VSR2.

In addition, clock signal lines (not shown in the Figure), high-level signal lines (VGH, not shown in the Figure), and low-level signal lines (VGL, not shown in the Figure) may be connected between the first gate driving circuit VSR1 and the driving chip IC and between the second gate driving circuit VSR2 and the driving chip IC. The driving chip IC may provide clock signals, high-level signals and low-level signals to the first gate driving circuit VSR1 and the second gate driving circuit VSR2.

For example, referring to FIG. 1, the array substrate 100 may include one first gate driving circuit VSR1 and one second gate driving circuit VSR2. In one embodiment, the one first gate driving circuit VSR1 and the one second gate driving circuit VSR2 may be disposed on opposite sides of the array substrate 100 in the second direction Y. In another embodiment, the one first gate driving circuit VSR1 and the one second gate driving circuit VSR2 may be disposed on a same side of the array substrate 100.

For another example, the array substrate 100 may include two first gate driving circuits VSR1 and two second gate driving circuits VSR2. Each end of the scanning signal line may be electrically connected to a first gate driving circuit VSR1 of the two first gate driving circuits VSR1, and each end of the light-emitting control signal line Emit may be electrically connected to a second gate driving circuit VSR2 of the two second gate driving circuits VSR2.

For another example, the array substrate 100 may include two first gate driving circuits VSR1. One of the two first gate driving circuits VSR1 may be electrically connected to the an odd row of pixel circuits through scanning signal lines, and the other one of the two first gate driving circuits VSR1 may be electrically connected to an even row of pixel circuits through scanning signal lines.

For another example, the array substrate 100 may include two second gate driving circuits VSR2. One of the two second gate driving circuits VSR2 may be electrically connected to an odd row of pixel circuits through light-emitting control signal lines, and the other one of the two second gate driving circuits VSR2 may be electrically connected to an even row of pixel circuits through light-emitting control signal lines.

The first gate driving circuit VSR1 and the second gate driving circuit VSR2 in the foregoing embodiments may merely be certain examples, which may not be limited by the present disclosure. In one embodiment, a gate driving circuit that is capable of simultaneously generating scanning signals and light-emitting control signals may be provided, which may not be limited by the present disclosure.

Figure 2:
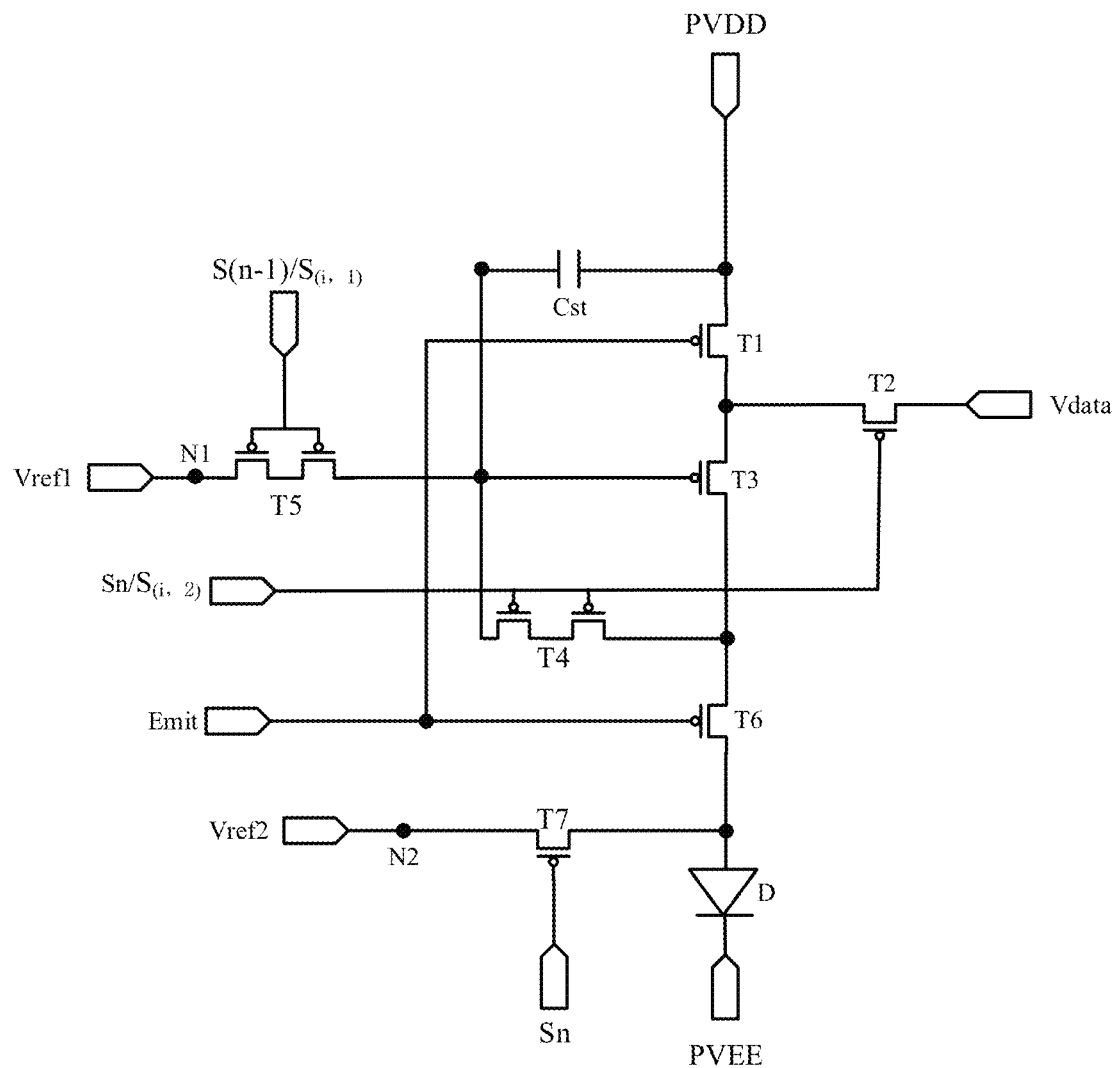
FIG. 2 illustrates a schematic diagram of a circuit structure of an exemplary pixel circuit consistent with disclosed embodiments of the present disclosure.

In one embodiment, for illustrative purposes, FIG. 2 illustrates the pixel circuit 10 including a storage capacitor Cst and seven transistors as an example. Referring to FIG. 2, T1 may be a power-writing transistor, T2 may be a data-writing transistor, T3 may be a driving transistor, T4 may be a compensation transistor, T5 may be a gate initialization transistor, T6 may be a light-emitting control transistor, T7 may be an anode initialization transistor, D may be a light-emitting element, PVEE may be a common power signal terminal, S(n−1) and Sn may be the first scanning signal line and the second scanning signal line, respectively, and N1 and N2 may represent connection nodes. The connection modes of each transistor and the signal line may be shown in FIG. 2, which may not be described in detail herein.

Referring to FIG. 2, taking the $i^{th}$ (i may be a positive integer) row of pixel circuits as an example, the first scanning signal line $S_{(i, 1)}$ and the second scanning signal line $S_{(i, 2)}$ connected to the $i^{th}$ row of pixel circuits 10 may be described. The first scanning signal line $S_{(i, 1)}$ may control the turn-on and turn-off of the gate initialization transistor T5 of the pixel circuit, and may reset the gate potential of the driving transistor T3 when the gate initialization transistor T5 is turned on. The second scanning signal line $S_{(i, 2)}$ may control the turn-on and turn-off of the data-writing transistor T2 and the compensation transistor T4 of the pixel circuit, and when the data-writing transistor T2 and the compensation transistor T4 are turned on, may write the data signal on the data signal line Vdata to the gate of the driving transistor T1 and may compensate a threshold voltage of the driving transistor T3. In certain design of the pixel circuit, the scanning signal line Sn may be multiplexed to control the turn-on and turn-off of the anode initialization transistor T7 of the pixel circuit, and may reset an anode potential of the light-emitting element when the anode initialization transistor T7 is turned on. In view of this, the anode initialization transistor T7 may not need a separate scanning signal line.

In other words, the first scanning signal line may be understood as a scanning signal line connected to a control terminal of the gate initialization transistor of the pixel circuit 10. The second scanning signal line may be understood as a data signal line connected to a control terminal of the data-writing transistor, a control terminal of the compensation transistor, and a control terminal of the anode initialization transistor in the pixel circuit 10. Each row of pixel circuits 10 used for display may at least be connected with a corresponding first scanning signal line and a corresponding second scanning signal line.

It should be noted that in one embodiment, referring to FIG. 1, in adjacent two rows of pixel circuits, an upper row of pixel circuits may be connected to the scanning signal lines S(n−1) and Sn, and a lower row of pixel circuits may be connected to the scanning signal lines Sn and S(n+1). For the upper row of pixel circuits 10, the corresponding first scanning signal line may be S(n−1), and the corresponding second scanning signal line may be Sn. For the lower row of pixel circuits 10, the corresponding first scanning signal line may be Sn, and the corresponding second scanning signal line may be S(n+1).

The power signal line PVDD may be configured to provide a power supply voltage to the driving transistor T3, and a voltage on the power signal line PVDD may be a positive voltage. A voltage on the common power signal terminal PVEE may be a negative voltage. The first reference signal line Vref1 and the second reference signal line Vref2 may be configured to provide reset voltage signals, and voltages on the first reference signal line Vref1 and the second reference signal line Vref2 may be negative voltages.

For illustrative purposes, in the following embodiments, each transistor in the pixel circuit 10 may be a P-type transistor as an example for description. In another embodiment, each transistor in the pixel circuit 10 may be an N-type transistor. In certain embodiments, part of transistors may be P-type transistors, and another part of transistors may be N-type transistors. Different enable levels may be provided according to different types of transistors, and the enable level may be a level that enables the transistor to be turned on. For example, for the N-type transistor, the enable level may be a high-level, and for the P-type transistor, the enable level may be a low-level.

Figure 3:
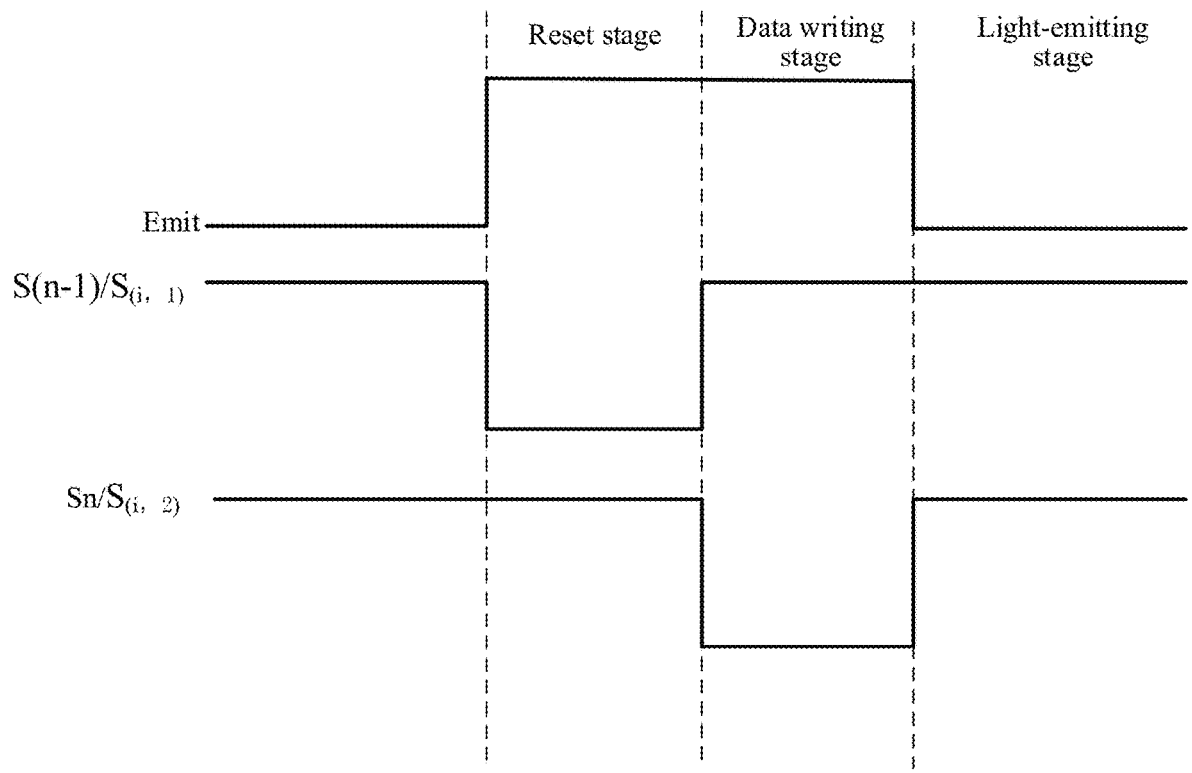
FIG. 3 illustrates a schematic timing sequence diagram of an exemplary pixel circuit in FIG. 2 consistent with disclosed embodiments of the present disclosure.

Referring to FIG. 3, a driving process of the pixel circuit 10 may include a reset stage, a data-writing stage, and a light-emitting stage. For illustrative purposes, the $i^{th}$ row of pixel circuits may be used as an example for description. In the reset stage, the first scanning signal line $S_{(i, 1)}$ may provide a low-level signal, and the gate initialization transistor T5 may be turned on to reset the gate potential of the driving transistor T3. In the data-writing stage, the second scanning signal line $S_{(i, 2)}$ may provide a low-level signal, the data-writing transistor T2 and the compensation transistor T4 may be turned on, the data signal Vdata on the data signal line may be written to the gate of the driving transistor T1, and the threshold voltage of the driving transistor T3 may be compensated; further, the anode initialization transistor T7 may be turned on to reset the anode potential of the light-emitting element. In the light-emitting stage, the light-emitting control signal line Emit may provide a low-level signal, the power-writing transistor T1 and the light-emitting control transistor T6 may be turned on, the driving current generated by the driving transistor T3 may be transmitted to the light-emitting element, and the light-emitting element may emit light.

FIG. 2 and FIG. 3 may merely be examples and may not intend to limit the present disclosure.

Figure 4:
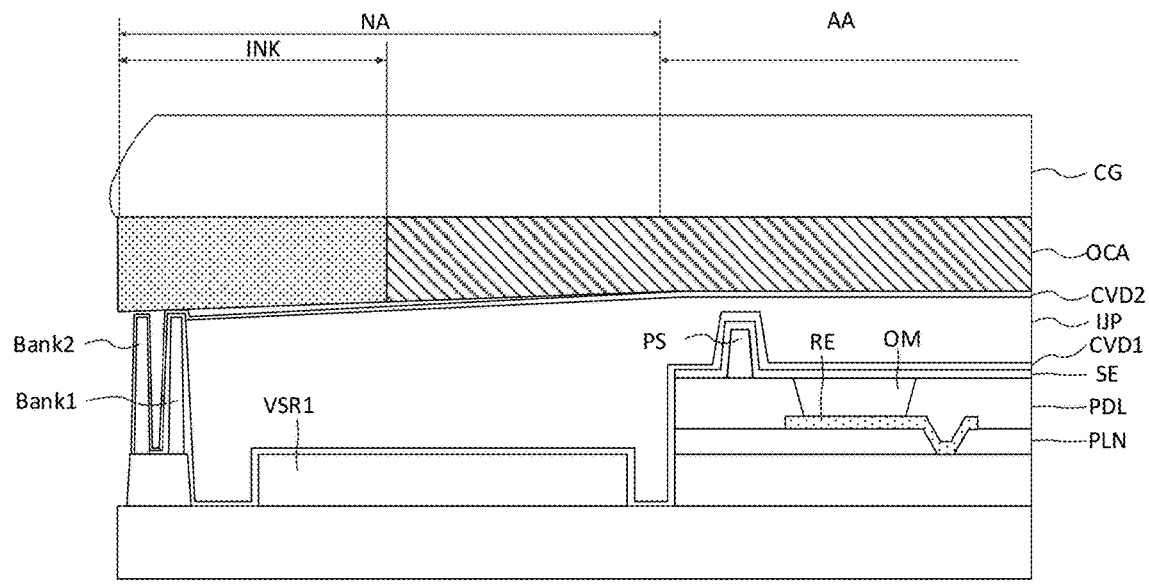
FIG. 4 illustrates a schematic cross-sectional view of an exemplary array substrate consistent with disclosed embodiments of the present disclosure.

Referring to FIG. 4, the array substrate may include a display region AA and a non-display region NA. The non-display region NA may include an ink region INK. In one embodiment, the array substrate may include a substrate 01 and a driving circuit layer 02 disposed on a side of the substrate 01. FIG. 4 also illustrates a planarization layer PLN, a pixel definition layer PDL, the light-emitting element (including an anode RE, an organic light-emitting layer OM, and a cathode SE), a supporting pillar PS, a thin film encapsulation layer (including a first inorganic layer CVD1, an organic layer IJP and a second inorganic layer CVD2), an optical adhesive layer OCA, and a cover plate CG. In addition, FIG. 4 illustrates the first gate driving circuit VSR1, a first barrier spacer Bank1, and a second barrier spacer Bank2. The first gate driving circuit VSR1 may be disposed in the non-display region NA of the driving circuit layer 02.

Figure 5:
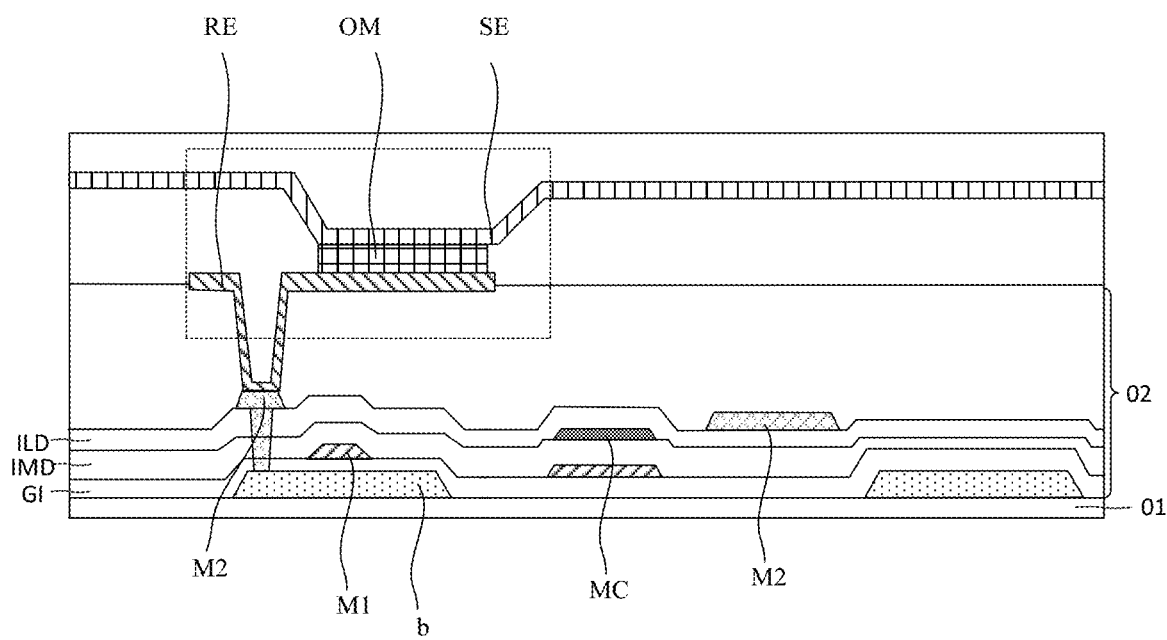
FIG. 5 illustrates a schematic cross-sectional view of another exemplary array substrate consistent with disclosed embodiments of the present disclosure.

The pixel circuit 10 may be disposed in the driving circuit layer 02, and the pixel circuit 10 may be connected to the anode RE of the light-emitting element. Referring to FIG. 5, the driving circuit layer 02 of the array substrate may include a gate metal layer M1, a capacitor metal layer MC, and a source-drain metal layer M2 that are sequentially stacked in a direction away from the substrate 01. A semiconductor layer b may be disposed between the gate metal layer M1 and the substrate 01. An insulating layer may be disposed between adjacent metal layers and between the semiconductor layer b and the gate metal layer M1. In one embodiment, a gate insulating layer GI may be disposed between the gate metal layer M1 and the semiconductor layer b. A capacitor insulating layer IMD may be disposed between the capacitor metal layer MC and the gate metal layer M1. An interlayer dielectric layer ILD may be disposed between the source-drain metal layer M2 and the capacitor metal layer MC.

The semiconductor layer b may be a semiconductor layer where an active layer of a transistor is located. The gate metal layer M1 may be a conductive metal layer where a gate of the transistor is located. The capacitor metal layer MC may be a conductive metal layer where one of plates of the capacitor is located. The source-drain metal layer M2 may be a conductive metal layer where source and drain of the transistor are located.

In one embodiment, the scanning signal lines S(n−1), Sn, S(n+1) and the light-emitting control signal line Emit may be disposed in the gate metal layer M1. The first reference signal line Vref1 and the second reference signal line Vref2 may be disposed in the capacitor metal layer MC. The power signal line PVDD and the data signal line Vdata may be disposed in the source-drain metal layer M2. The film layer where each signal line is disposed may be arranged in any other way, which may not be limited by the present disclosure.

If a same reset voltage signal is used to reset the gate potential of the driving transistor T3 and the anode potential of the light-emitting element, in other words, if the gate initialization transistor T5 and the anode initialization transistor T7 are electrically connected to a same reference signal line, a problem of uneven display at low grayscale under high refresh rate may tend to occur. Referring to FIG. 2, through configuring the gate initialization transistor T5 and the anode initialization transistor T7 to be electrically connected to different reference signal lines, e.g., the gate initialization transistor T5 may be electrically connected to the first reference signal line Vref1, and the anode initialization transistor T7 may be electrically connected to the second reference signal line Vref2, different reset voltage signals may be used to reset the gate potential of the driving transistor T3 and the anode potential of the light-emitting element, such that the problem of uneven display at low grayscale under high refresh rate may be improved.

Figure 6:
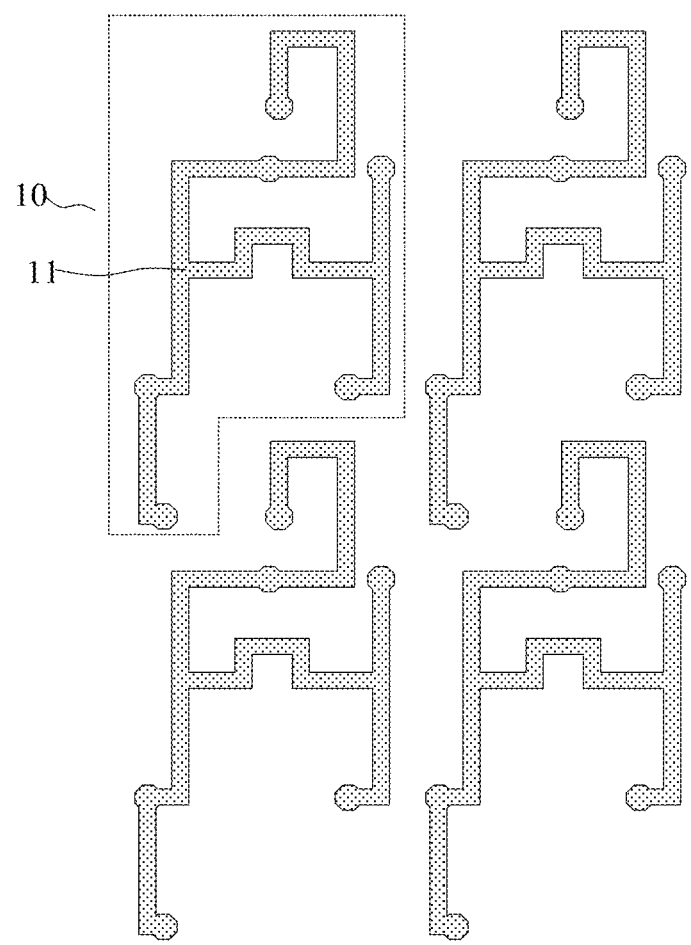
FIG. 6 illustrates a schematic layout diagram of a first semiconductor portion of a pixel circuit in a related art.

Referring to FIG. 6, when the gate initialization transistor T5 is electrically connected to the first reference signal line Vref1, and the anode initialization transistor T7 is electrically connected to the second reference signal line Vref2, each semiconductor portion 11 of the pixel circuit 10 may be independent. The preparation process of the semiconductor portion may include a high-temperature process, such as annealing and activation processes. During the high-temperature process, static electricity may irreversibly affect the performance of the first semiconductor portion, thereby affecting the performance of the corresponding transistor. The high-temperature process may cause electrostatic influence at different extent on the first semiconductor portion 11 at different positions, and may cause the transistors of the pixel circuits at different positions to be inconsistent, thereby affecting display uniformity.

Figure 7:
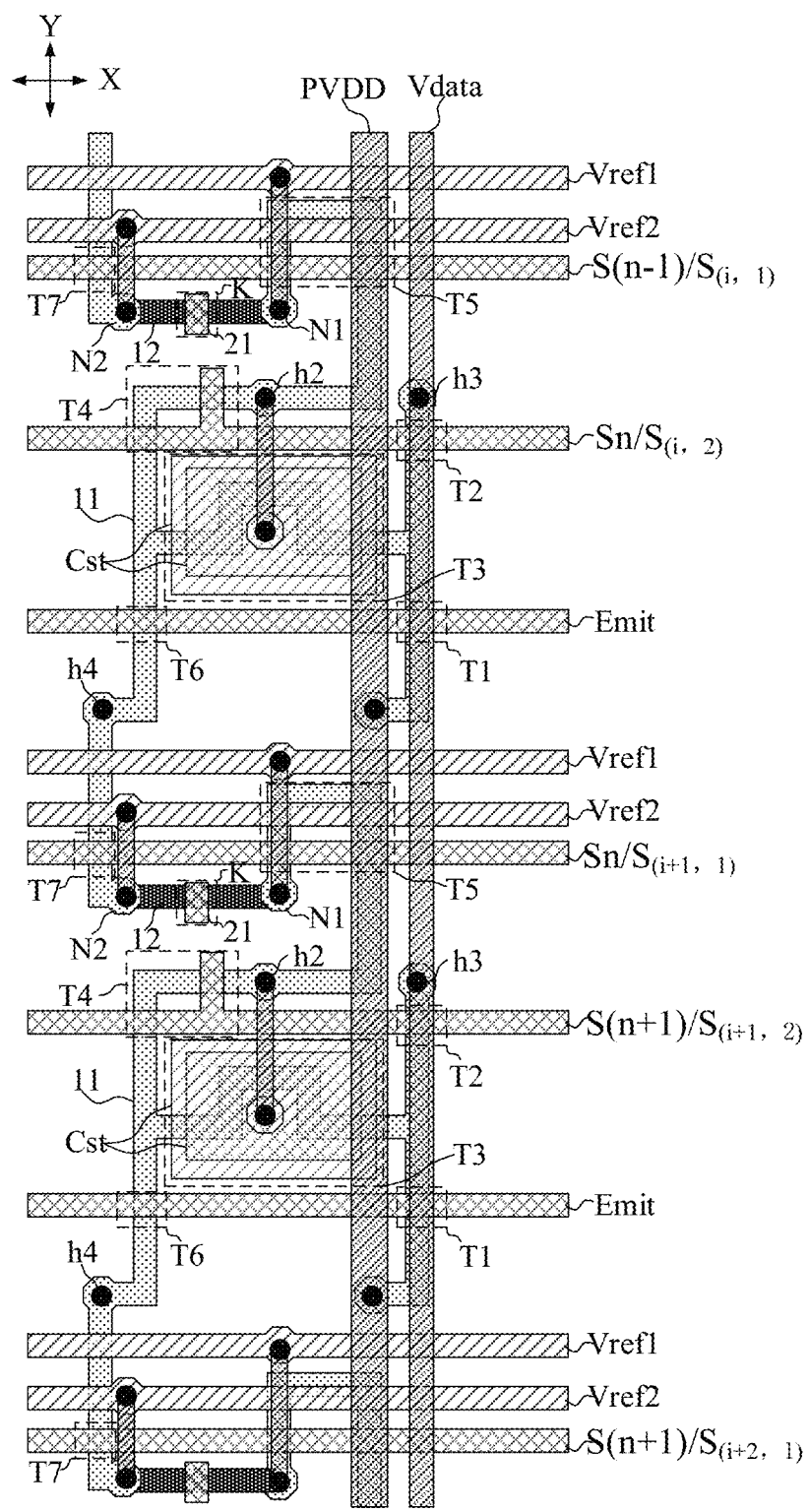
FIG. 7 illustrates a schematic top view of a local layout diagram of an exemplary array substrate consistent with disclosed embodiments of the present disclosure.
Figure 8:
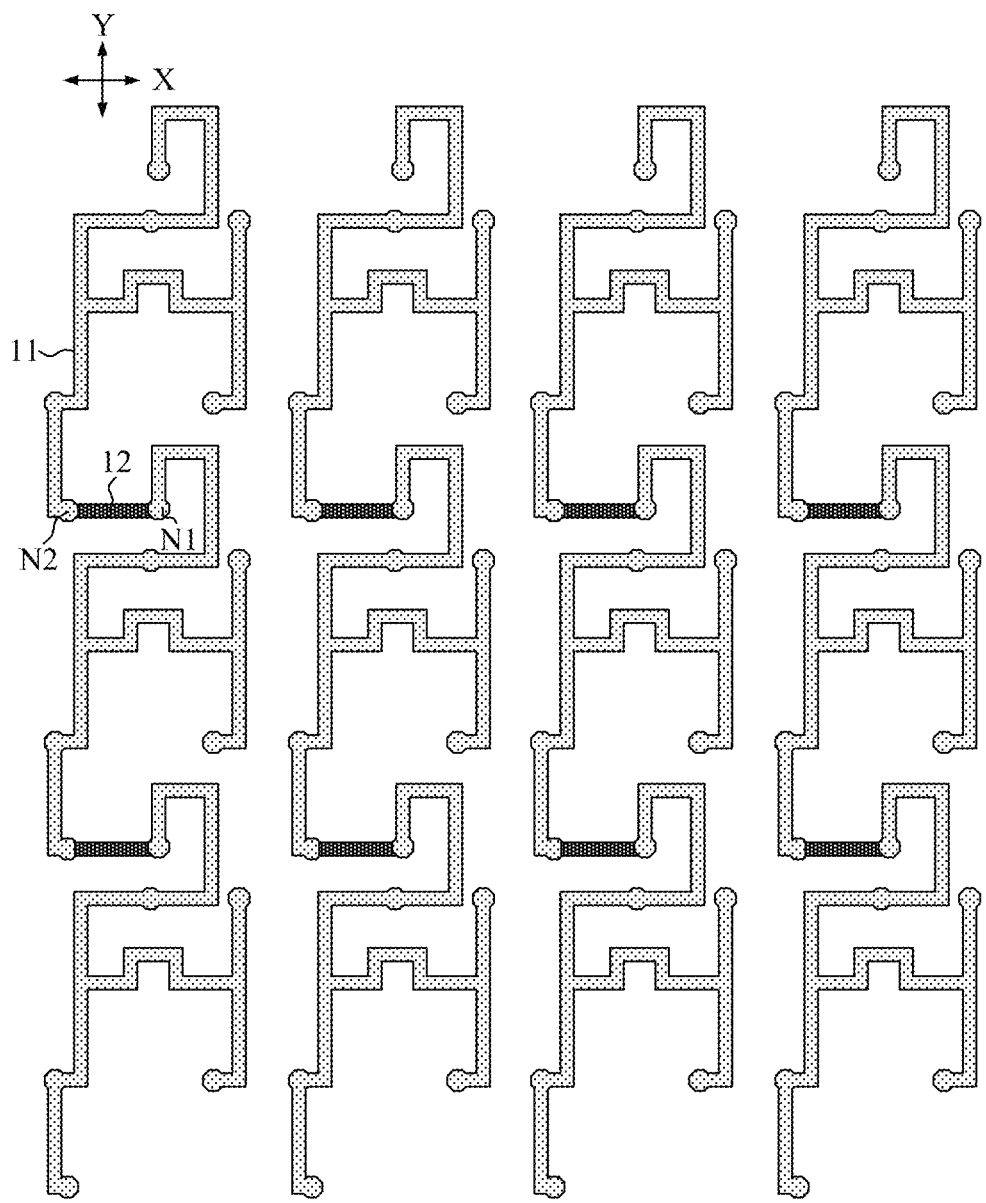
FIG. 8 illustrates a schematic layout diagram of a first semiconductor portion of an exemplary pixel circuit consistent with disclosed embodiments of the present disclosure.

In the disclosed embodiments, a method that is capable of connecting the first semiconductor portions 11 of the adjacent pixel circuits 10 in the second direction Y to each other without affecting the driving display of each pixel circuit 10 may be provided. Referring to FIG. 7 and FIG. 8, each pixel circuit 10 may include the first semiconductor portion 11. The first semiconductor portion 11 may be configured to form the active layer of each transistor in the pixel circuit 10. Among the plurality of transistors in a pixel circuit, each transistor structure may include an active layer. The active layers of the plurality of transistors in the pixel circuit may be connected together to form a patterned first semiconductor portion as shown in FIGS. 7-8. FIGS. 7-8 may merely illustrate examples, and the first semiconductor portion 11 of the pixel circuit 10 may also have any other shape, which may not be limited by the present disclosure.

The first semiconductor portion 11 of each pixel circuit 10 may include the first node N1 and the second node N2. The first reference signal line Vref1 may be electrically connected to the first node N1, and the second reference signal line Vref2 may be electrically connected to the second node N2. In one embodiment, as shown in FIG. 7, the first node N1 and the second node N2 may be located on opposite sides of the driving transistor T3 in the second direction Y, respectively.

Figure 9:
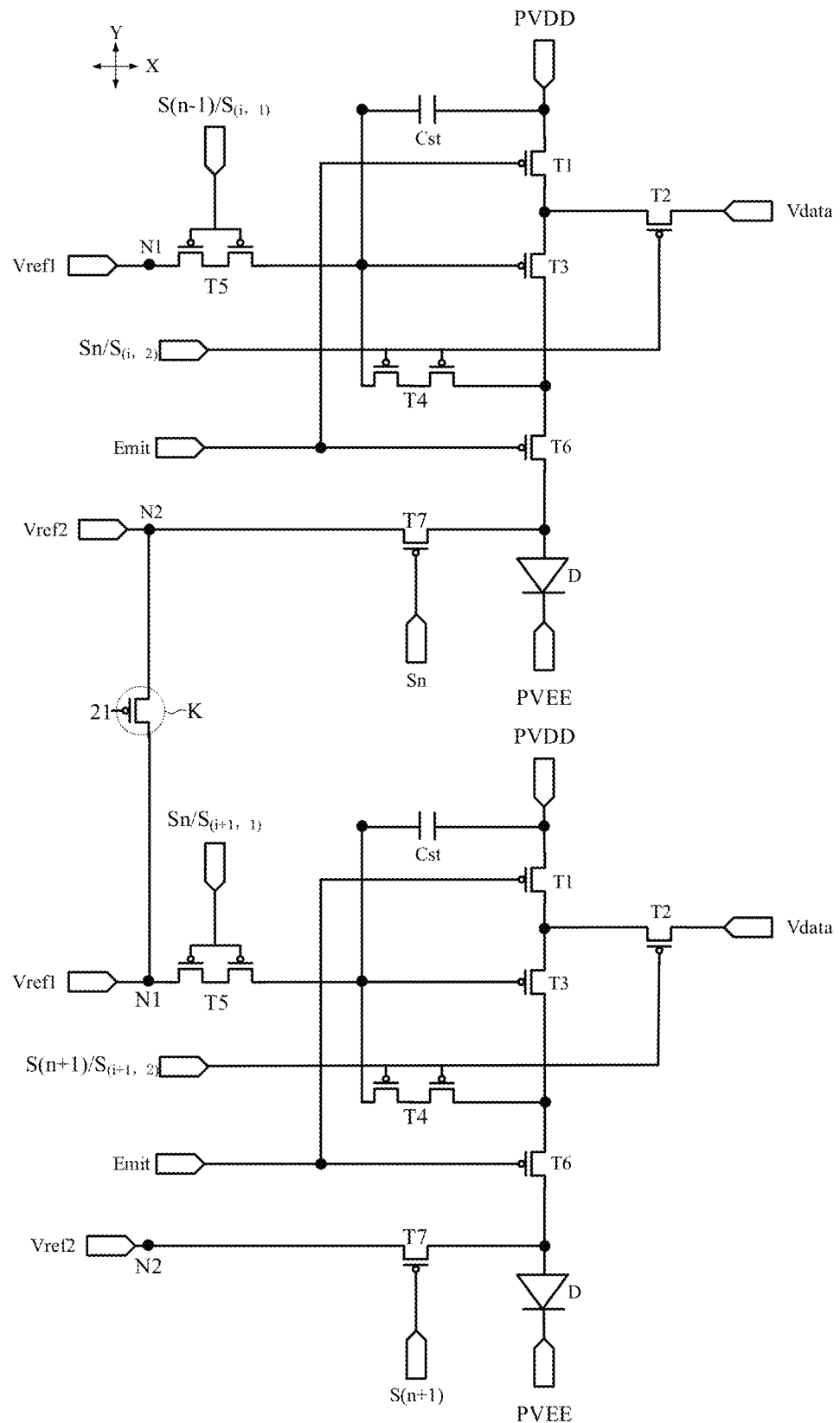
FIG. 9 illustrates a schematic diagram of a circuit structure of adjacent two pixel circuits in a second direction consistent with disclosed embodiments of the present disclosure.

In addition, for illustrative purposes, FIGS. 7-9 illustrate that the pixel circuit 10 may include a storage capacitor Cst and seven transistors as an example, which may not intend to limit the present disclosure. In one embodiment, the first reference signal line Vref1 and a first electrode of the gate initialization transistor T5 may be connected to the first node N1. The first electrode of the gate initialization transistor T5 may be a source, and a partial region of the first semiconductor portion 11 may be the first electrode of the gate initialization transistor T5. The second reference signal line Vref2 and a first electrode of the anode initialization transistor T7 may be connected to the second node N2. The first electrode of the anode initialization transistor T7 may be the source, and a partial region of the first semiconductor portion 11 may be the first electrode of the anode initialization transistor T7.

The array substrate 100 may further include a second semiconductor portion 12 and a control portion 21. Referring to FIGS. 7-9, in adjacent two pixel circuits 10 in the second direction Y, the first node N1 of one pixel circuit 10 may be connected to the second node N2 of the other pixel circuit 10 through the second semiconductor portion 12.

An orthographic projection of the control portion 21 on the plane of the array substrate 100 may at least partially overlap an orthographic projection of the second semiconductor portion 12 on the plane of the array substrate 100. The control portion 21 and the second semiconductor portion 12 may form a switch element K. Because the first node N1 and the second node N2 are connected to different reference signal lines, if the first node N1 is directly electrically connected to the second node N2, a short circuit phenomenon may occur. Therefore, the switch element K may be configured to cut off the signal transmission between the first node N1 and the second node N2. The switch element K may be a transistor, and the overlapped region between the second semiconductor portion 12 and control portion may be the active layer of the switch element K. The control portion 21 may be the gate of the switch element K, and the source and drain of the switch element K may be connected to the first node N1 and the second node N2, respectively. The switch element K may be controlled to be turned on or turned off by controlling the potential of the control portion 21.

On the one hand, the first semiconductor portions 11 of the adjacent pixel circuits 10 in the second direction Y may be connected to each other through the second semiconductor portion 12, such that the first semiconductor portion 11 of each pixel circuit 10 may no longer be isolated. The adjacent first semiconductor portion 11 and the second semiconductor portion 12 in the second direction Y may be understood as forming a continuous semiconductor wiring, such that static electricity may be evenly distributed on the continuous semiconductor wiring. Furthermore, the reliability and uniformity of the performance of the first semiconductor portion 11 in the subsequent high-temperature manufacturing process may be improved, such that the driving capabilities of the pixel circuits may be basically the same, thereby achieving the display uniformity and improving the display effect. On the other hand, although the adjacent first semiconductor portions 11 are physically connected to each other through the second semiconductor portion 12, the control portion 21 and the second semiconductor portion 12 may form the switch element K, and the switch element K may cut off the electrical connection between the first node N1 and the second node N2. Therefore, the first node N1 and the second node N2 may not be shorted, and thus may not affect the display of the light-emitting element driven by each pixel circuit 10.

In one embodiment, the first semiconductor portion 11 may be one of polysilicon and metal oxide semiconductor. The pixel circuit using polysilicon as the first semiconductor portion 11 may have a substantially fast response speed, and the pixel circuit using the metal oxide semiconductor as the first semiconductor portion 11 may generate a stable light-emitting current.

In one embodiment, the second semiconductor portion 12 may be one of polysilicon and metal oxide semiconductor.

In certain embodiments, the second semiconductor portion 12 and the first semiconductor portion 11 may be made of a same material and formed in a same film layer. In view of this, the second semiconductor portion 12 and the first semiconductor portion 11 may be simultaneously formed in a same process, which may simplify the process.

When the second semiconductor portion 12 and the first semiconductor portion 11 are formed in the same film layer, the second semiconductor portion 12 may be directly connected with the first node N1 and the second node N2, and via may not be required. When the second semiconductor portion 12 and the first semiconductor portion 11 are formed in different layers, the second semiconductor portion 12 may be connected with the first node N1 and the second node N2 through vias.

Figure 10:
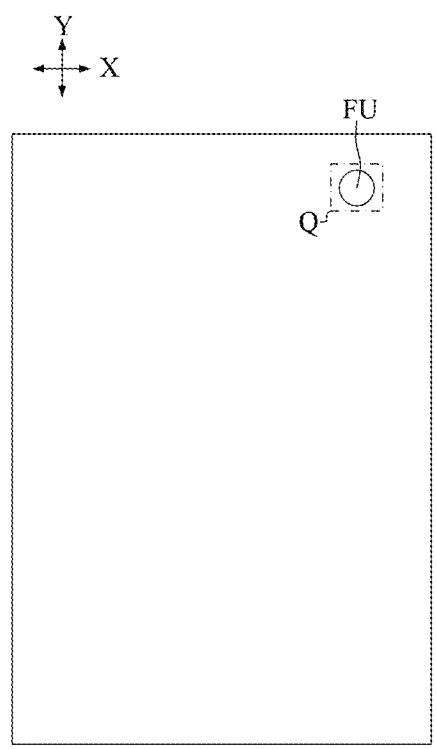
FIG. 10 illustrates a schematic top view of another exemplary array substrate consistent with disclosed embodiments of the present disclosure.

In certain embodiments, referring to FIG. 10, the array substrate 100 may include a function region FU. A functional device such as a camera, an earpiece, an optical fingerprint sensor, etc., may be disposed at the position corresponding to the function region FU. The function region FU may have a circle shape, a rectangle shape, a rounded rectangle shape, etc., which may not be limited by the present disclosure. A quantity of the function regions FU may be one or more, which may not be limited by the present disclosure. The function region FU may be a non-display region or a display region. When the function region FU is a display region, the function region FU may have a corresponding pixel circuit. To improve the light transmittance of the function region FU, the pixel circuit corresponding to the function region FU may be disposed in any other region outside the function region FU. Pixel circuits 10 may be disposed on both sides of the function region FU in the second direction Y.

If the first semiconductor portions 11 on both sides of the function region FU in the second direction Y are not connected, the static electricity distributed on the first semiconductor portions 11 on both sides of the function region FU in the second direction Y may be uneven, which may affect display uniformity. For example, the display on a side of the function region FU along the second direction Y at the low grayscale may be dim.

Figure 11:
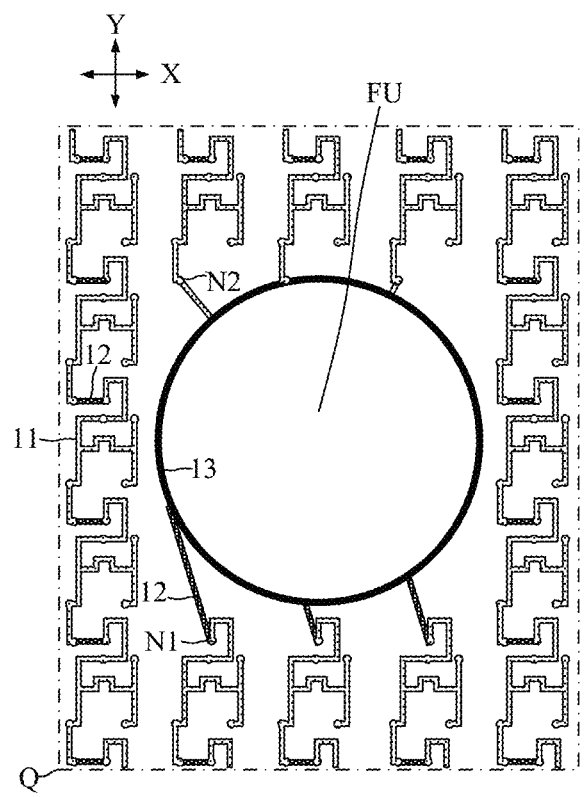
FIG. 11 illustrates a schematic layout diagram of a semiconductor portion in a Q region of an exemplary array substrate in FIG. 10 consistent with disclosed embodiments of the present disclosure.
Figure 12:
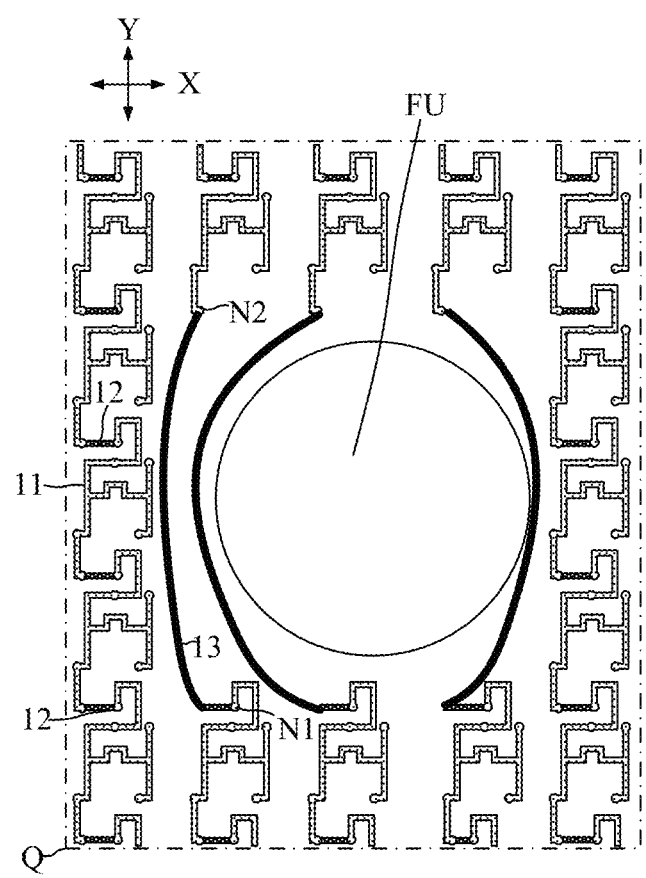
FIG. 12 illustrates a schematic layout diagram of a semiconductor portion in a Q region of another exemplary array substrate in FIG. 10 consistent with disclosed embodiments of the present disclosure.

Referring to FIG. 11 or FIG. 12, the array substrate 100 may further include a third semiconductor portion 13. The third semiconductor portion 13 may be extended around the function region FU. The first semiconductor portions 11 and the second semiconductor portions 12 disposed on both sides of the function region FU in the second direction Y may be connected to each other through the third semiconductor portion 13. It should be understood that the first node N1 of the first semiconductor portion 11 disposed on one side of the function region FU and the second node N2 of the first semiconductor portion 11 disposed on the other side of the function region FU in the second direction Y may be connected to each other through the second semiconductor portion 12 and the third semiconductor portion 13.

In the disclosed embodiments, the first semiconductor portions 11 and the second semiconductor portions 12 disposed on both sides of the function region FU in the second direction Y may be connected to each other through the third semiconductor portion 13, such that the first semiconductor portions 11 on both sides of the function region FU in the second direction Y may no longer be isolated. The first semiconductor portions 11, the second semiconductor portions 12, and the third semiconductor portions 13 disposed on both sides of the function region FU in the second direction Y may be understood as forming a continuous semiconductor wiring, such that the static electricity may be evenly distributed on the continuous semiconductor wiring corresponding to the function region FU. Furthermore, the reliability and uniformity of the performance of the first semiconductor portions 11 on both sides of the function region FU in the second direction Y in the subsequent high-temperature manufacturing process may be improved, such that the driving capabilities of the pixel circuits may be basically the same, thereby achieving the display uniformity and improving the display effect.

In addition, the first semiconductor portions 11 and the second semiconductor portions 12 disposed on both sides of the function region FU in the second direction Y may be connected to each other through the third semiconductor portion 13, such that the structure of the semiconductor portion corresponding to the function region FU may tend to be consistent with the structure of the semiconductor portion in any other region, such that the driving capabilities of the pixel circuits of the entire array substrate may be basically the same, thereby achieving display uniformity and improving the display effect.

In one embodiment, referring to FIG. 11, the third semiconductor portion 13 may fully surround the function region FU. The third semiconductor portion 13 may be connected with the first semiconductor portions 11 and the second semiconductor portions 12 that are disposed on both sides of the function region FU in the second direction Y.

In one embodiment, referring to FIG. 12, for illustrative purposes, the second direction Y may be a column direction as an example. A quantity of third semiconductor portions 13 may be the same as a quantity of columns of pixel circuits 10 that are disposed on both sides of the function region FU in the second direction Y. Each third semiconductor portion 13 may merely connect the first semiconductor portions 11 and the second semiconductor portions 12 disposed in a same column.

In certain embodiments, the first semiconductor portion 11, the second semiconductor portion 12, and the third semiconductor portion 13 may be made of a same material and formed in a same film layer. In view of this, the first semiconductor portion 11, the second semiconductor portion 12, and the third semiconductor portion 13 may be simultaneously formed in a same process, which may simplify the process.

In one embodiment, the first semiconductor portion 11, the second semiconductor portion 12, and the third semiconductor portion 13 may be made of a material including one of polysilicon and metal oxide semiconductor.

Figure 13:
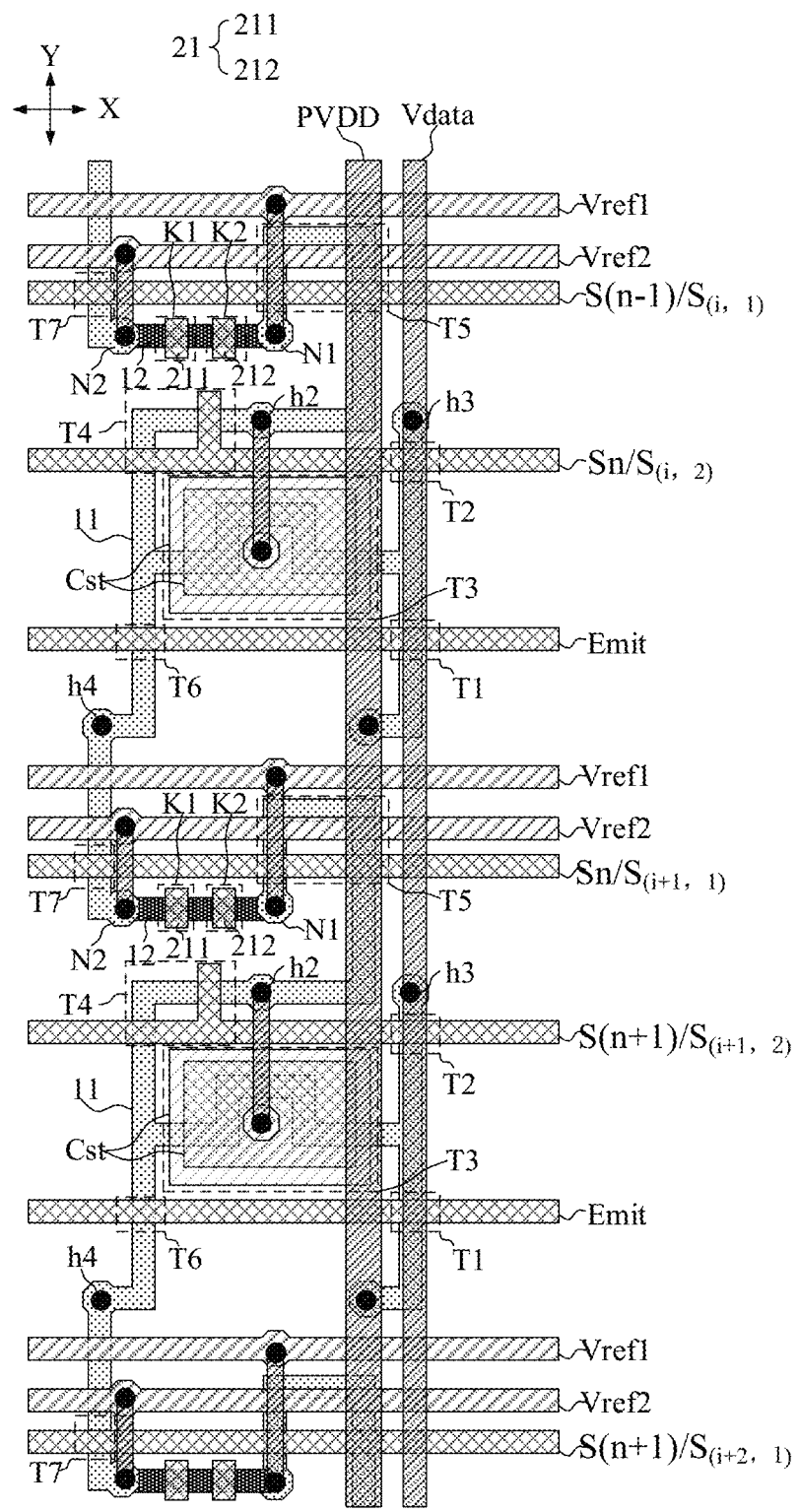
FIG. 13 illustrates a schematic top view of a local layout diagram of another exemplary array substrate consistent with disclosed embodiments of the present disclosure.

In certain embodiments, referring to FIG. 13, the control portion 21 may include a first control portion 211 and a second control portion 212. An orthographic projection of each of the first control portion 211 and the second control portion 212 on the plane of the array substrate 100 may at least partially overlap the orthographic projection of the second semiconductor portion 12 on the plane of the array substrate 100. The orthographic projections of the first control portion 211 and the second control portion 212 on the plane of the array substrate 100 may not overlap.

It should be understood that the control portion 21 and the second semiconductor portion 12 may form two switch elements connected in series between the first node N1 and the second node N2. Specifically, the first control portion 211 and the second semiconductor portion 12 may form a first switch element K1, and the second control portion 212 and the second semiconductor portion 12 may form a second switch element K2. The first switch element K1 and the second switch element K2 together may be configured to cut off the electrical connection between the first node N1 and the second node N2. In one embodiment, the potentials of the first control portion 211 and the second control portion 212 may be controlled to keep the first switch element K1 and the second switch element K2 always at an off-state, or to make the conduction states of the first switch element K1 and the second switch element K2 be opposite at a same moment. For example, when the first switch element K1 is in a turned-on state, the second switch element K2 may be in a turned-off state, and when the first switch element K1 is in a turned-off state, the second switch element K2 may be in a turned-on state.

In the present disclosure, by dividing the control portion 21 into the first control portion 211 and the second control portion 212, two switch elements connected in series between the first node N1 and the second node N2 may be formed. Compared with a case where merely one switch element is connected between the first node N1 and the second node N2, the switch element between the first node N1 and the second node N2 may be prevented from generating leakage current, which may prevent the first node N1 from being electrically connected to the second node N2 to be shorted.

Figure 14:
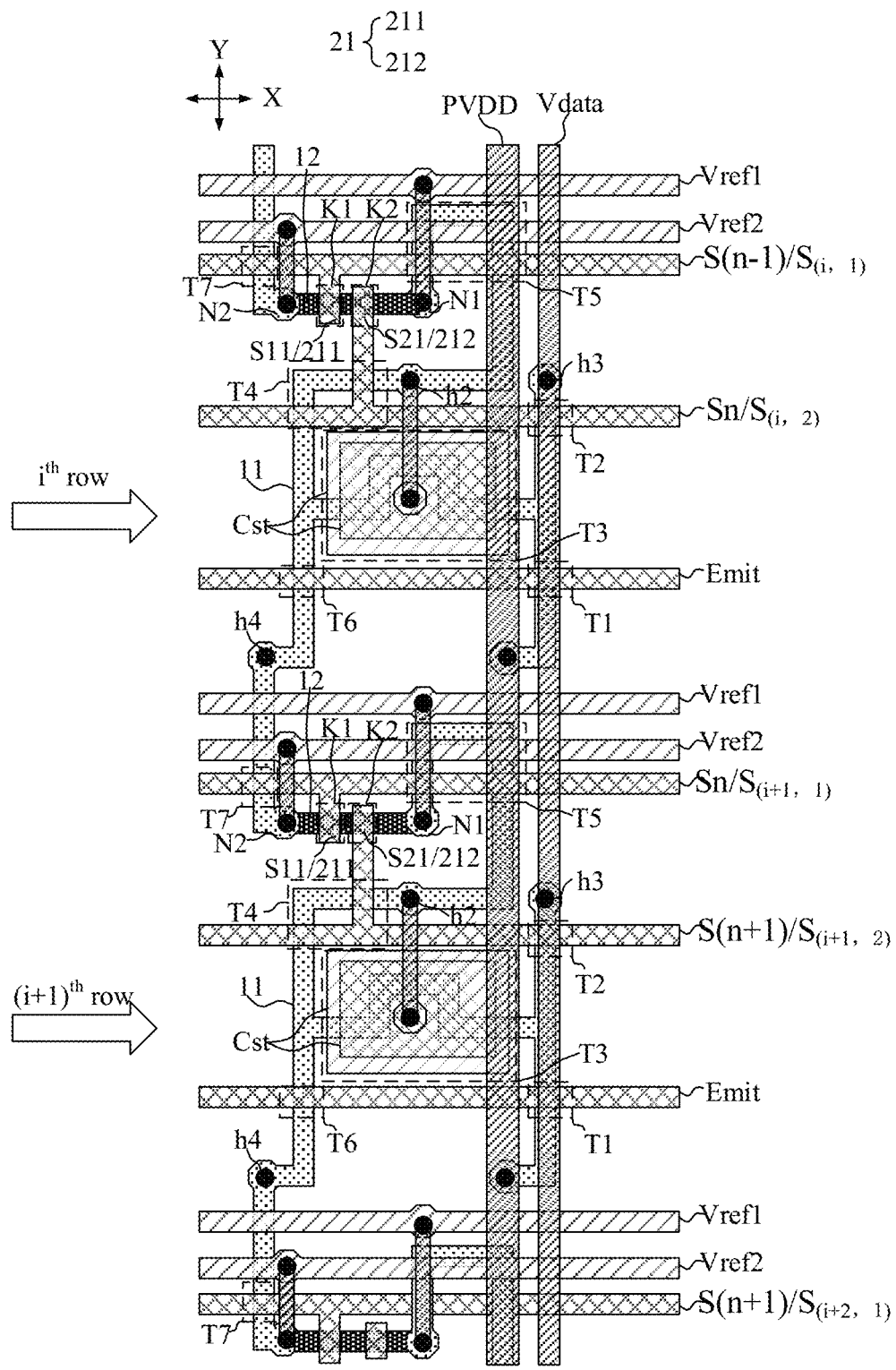
FIG. 14 illustrates a schematic top view of a local layout diagram of another exemplary array substrate consistent with disclosed embodiments of the present disclosure.

FIG. 14 exemplary illustrates two pixel circuits in adjacent two rows. In certain embodiments, referring to FIG. 14, in the adjacent two rows of pixel circuits, the $i^{th}$ row of pixel circuits may be connected to the scanning signal lines S(n−1) and Sn, and the i+1$^{th}$ row of pixel circuits may be connected to the scanning signal lines Sn and S(n+1). For the $i^{th}$ row of pixel circuits 10, the corresponding first scanning signal line $S_{(i, 1)}$ may be the scanning signal line S(n−1), and the corresponding second scanning signal line $S_{(i, 2)}$ may be the scanning signal line Sn. For the i+1$^{th}$ row of pixel circuits 10, the corresponding first scanning signal line $S_{(i+1, 1)}$ may be the scanning signal line Sn, and the corresponding second scanning signal line $S_{(i+1, 2)}$ may be the scanning signal line S(n+1). It should be understood that the scanning signal line Sn may not only serve as the second scanning signal line $S_{(i, 2)}$ corresponding to the $i^{th}$ row of pixel circuits, but also serve as the first scanning signal line $S_{(i+1, 1)}$ corresponding to the i+1$^{th}$ row of pixel circuits in the adjacent two rows of pixel circuits. Both the first scanning signal line and the second scanning signal line of the array substrate 100 may be extended along the first direction X, and both the first scanning signal line and the second scanning signal line may be electrically connected to the pixel circuit 10. The first scanning signal line may include a first branch portion S11, and the first branch portion S11 may be multiplexed as the first control portion 211. The second scanning signal line may include a second branch portion S21, and the second branch portion S21 may be multiplexed as the second control portion 212.

Figure 15:
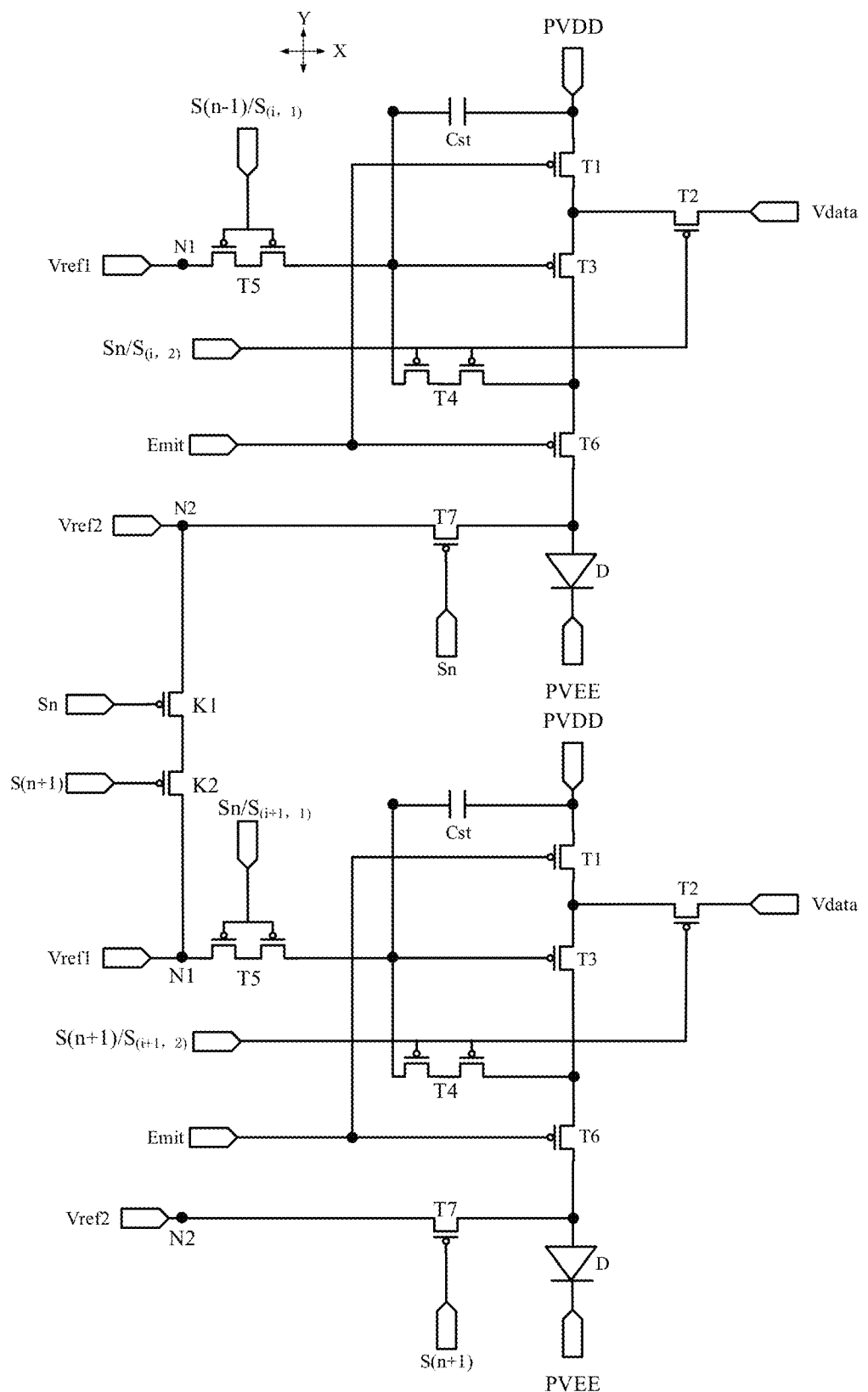
FIG. 15 illustrates a schematic diagram of another circuit structure of adjacent two pixel circuits in a second direction consistent with disclosed embodiments of the present disclosure.

In one embodiment, referring to FIG. 14, for the first control portion and the second control portion between adjacent two rows of pixel circuits, the first branch portion S11 of the first scanning signal line $S_{(i+1, 1)}$ corresponding to the i+1$^{th}$ row of pixel circuits may be multiplexed as the first control portion 211, and the second branch portion S21 of the second scanning signal line $S_{(i+1, 2)}$ corresponding to the i+1$^{th}$ row of pixel circuits may be multiplexed as the second control portion 212. Referring to FIG. 15, for the first control portion and the second control portion between the adjacent two rows of pixel circuits, because the first branch portion S11 is multiplexed as the first control portion 211, the gate of the first switch element K1 may be connected to the first scanning signal line Sn. Because the second branch portion S21 is multiplexed as the second control portion 212, the gate of the second switch element K2 may be connected to the second scanning signal line S(n+1).

The signals on the first scanning signal line $S_{(i, 1)}$ and the second scanning signal line $S_{(i, 2)}$ corresponding to the $i^{th}$ row of pixel circuits may correspond to the signals on the scanning signal line S(n−1) and the scanning signal line Sn shown in FIG. 3, respectively. In other words, for the first scanning signal line $S_{(i, 1)}$ and the second scanning signal line $S_{(i, 2)}$ corresponding to the $i^{th}$ row of pixel circuits, in the reset stage, the first scanning signal line $S_{(i, 1)}$ may provide a low level, and the second scanning signal line $S_{(i, 2)}$ may provide a high level; in the data-writing stage, the first scanning signal line $S_{(i, 1)}$ may provide a high level, and the second scanning signal line $S_{(i, 2)}$ may provide a low level; and in the light-emitting stage, both the first scanning signal line $S_{(i, 1)}$ and the second scanning signal line $S_{(i, 2)}$ may provide a high level.

For illustrative purposes, the first switch element K1 and the second switch element K2 may be P-type transistors as an example. In one embodiment, referring to FIG. 3 and FIG. 15, in the $i^{th}$ row of pixel circuits, in the reset stage, because the first scanning signal line $S_{(i, 1)}$ provides a low level and the second scanning signal line $S_{(i, 2)}$ provides a high level, the first switch element K1 may be turned on, the second switch element K2 may be turned off, and there may be no electrical connection (signal transmission) between the first node N1 and the second node N2. In the data-writing stage, because the first scanning signal line $S_{(i, 1)}$ provides a high level and the second scanning signal line $S_{(i, 2)}$ provides a low level, the first switch element K1 may be turned off, the second switch element K2 may be turned on, and there may be no electrical connection between the first node N1 and the second node N2. In the light-emitting stage, because both the first scanning signal line $S_{(i, 1)}$ and the second scanning signal line $S_{(i, 2)}$ provide high levels, both the first switch element K1 and the second switch element K2 may be turned off, and there may be no electrical connection between the first node N1 and the second node N2. Therefore, during the entire driving process, there may be no electrical connection between the first node N1 and the second node N2.

In the present disclosure, by multiplexing the first branch portion S11 as the first control portion 211 and the second branch portion S21 as the second control portion 212, the scanning signals provided by the first scanning signal line and the second scanning signal may be directly used to control the first switch element K1 and the second switch element K2 without providing an additional signal wiring, which may simplify the structure of the array substrate.

In certain embodiments, referring to FIG. 14, the pixel circuit may include the compensation transistor T4, and the compensation transistor T4 may be a double-gate transistor. Compared with a single-gate transistor, the double-gate transistor may have a substantially high stability. The compensation transistor T4 may use a double-gate transistor, which may reduce the influence of the leakage current of the compensation transistor T4 on the gate potential of the driving transistor T3.

The compensation transistor T4 may have two gates, a partial region of the first semiconductor portion 11 may form an active layer of the compensation transistor T4, and the second branch portion S21 may overlap the region of the first semiconductor portion 11 that forms the active layer of the compensation transistor T4. The second branch S21 may be multiplexed as the gate of the compensation transistor T4. If the second branch portion S21 is not multiplexed as the gate of the compensation transistor T4, an additional branch portion may need to be drawn from the second scanning signal line as the gate of the compensation transistor T4. Through configuring the second branch portion S21 to be directly multiplexed as the gate of the compensation transistor T4, a quantity of branch portions of the second scanning signal line may be reduced, and the structure may be simplified.

Figure 16:
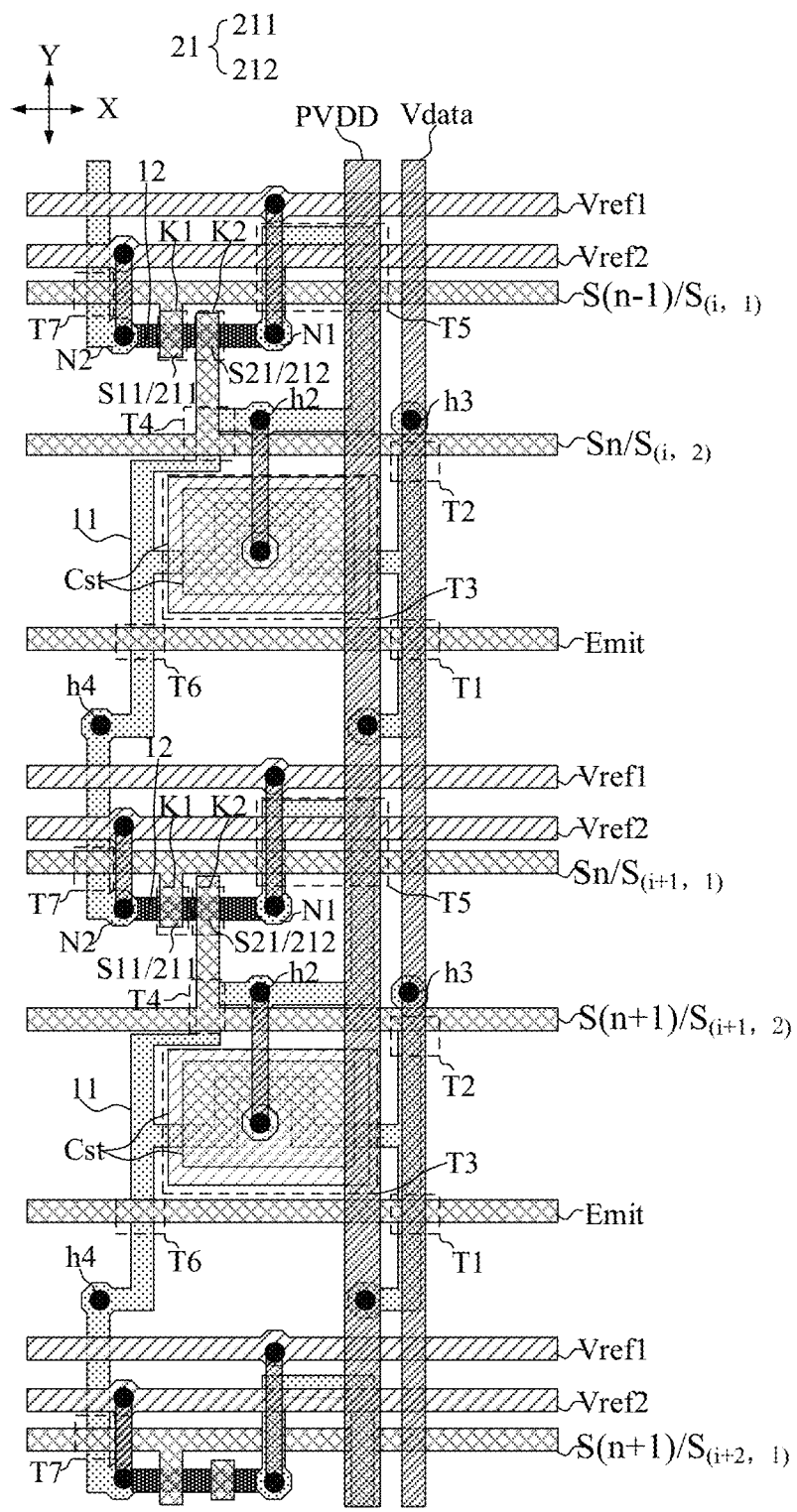
FIG. 16 illustrates a schematic top view of a local layout diagram of another exemplary array substrate consistent with disclosed embodiments of the present disclosure.

In certain embodiments, referring to FIG. 16, the compensation transistor T4 may be a single-gate transistor, such that the second scanning signal line may merely need to drive one gate, which may reduce the load on the second scanning signal line and improve the driving capability of the second scanning signal line. At the same time, an aperture ratio of the array substrate may increase to a certain extent.

In certain embodiments, referring to FIG. 14, the first branch portion S11 may be located on a side of the second branch portion S21 away from the first node N1 in the first direction X. Because the second branch portion S21 needs to be multiplexed as a gate of the compensation transistor T4, if the second branch portion S21 is set to be located on the side of the first branch portion S11 away from the first node N1 in the first direction X, the first semiconductor portion 11 may need to be expanded outward in the first direction X, which may increase pitch of the layout of the pixel circuit in the first direction X and may reduce pixels per inch (PPI). In the present disclosure, through configuring the first branch portion S11 to be located on the side of the second branch portion S21 away from the first node N1 in the first direction X, the first semiconductor portion 11 may not need to be expanded outward in the first direction X, which may not cause a decrease in PPI.

In a case that the PPI does not need to be high, the second branch portion S21 may also be set to be located on the side of the first branch portion S11 away from the first node N1 in the first direction X.

In certain embodiments, the control portion 21 may be electrically connected to a fixed voltage terminal (not shown in the Figure) on the array substrate 100, and the switch element K formed by the control portion 21 and the second semiconductor portion 12 may always be kept at off-state. For example, the fixed voltage signal line of the array substrate 100 may include the power signal line PVDD, the common power signal terminal (PVEE), the high-level signal line (VGH, not shown in the Figure), and the low-level signal line (VGL, not shown in the Figure), etc. The high-level signal line (VGH) may often be electrically connected to the gate driving circuit, and may provide a high level for the gate driving circuit. The low-level signal line (VGL) may often be electrically connected to the gate driving circuit, and may provide a low level for the gate driving circuit. The power signal line PVDD, the common power signal terminal (PVEE), the high-level signal line (VGH) and the low-level signal line (VGL) may be connected to different fixed voltage terminals, respectively.

In one embodiment, when the switch element K formed by the control portion 21 and the second semiconductor portion 12 is a P-type transistor, the control portion 21 may be electrically connected to a fixed voltage terminal connected to the power signal line PVDD or the high-level signal line (VGH). When the switch element K formed by the control portion 21 and the second semiconductor portion 12 is an N-type transistor, the control portion 21 may be electrically connected to the fixed voltage terminal connected to the common power signal terminal (PVEE) or the low-level signal line (VGL). In certain embodiments, in addition to the fixed voltage terminals connected to the power signal line PVDD, the common power signal terminal (PVEE), the high-level signal line (VGH), and the low-level signal line (VGL), the control unit 21 may be connected to any other additionally provided fixed voltage terminal.

Figure 17:
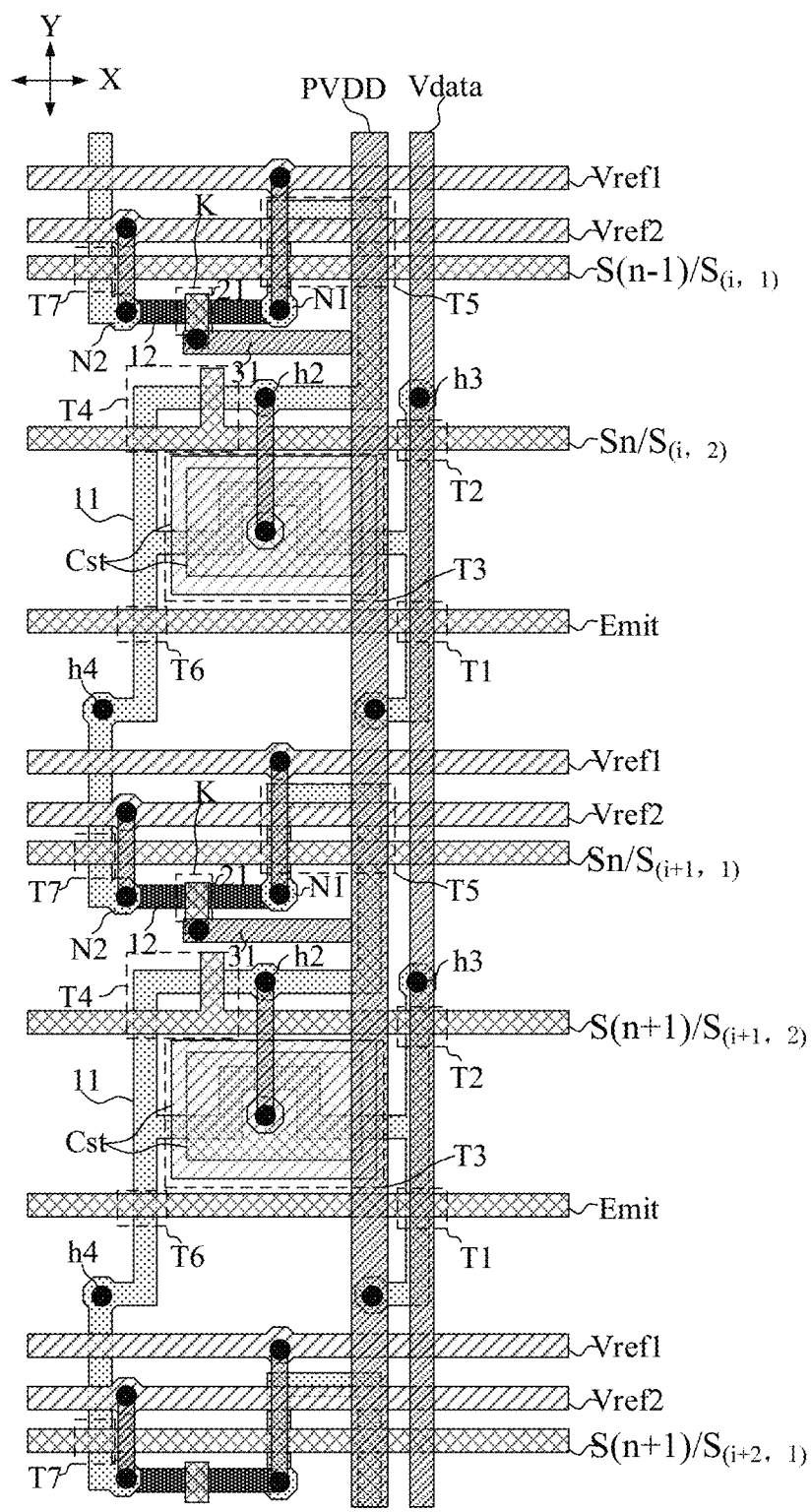
FIG. 17 illustrates a schematic top view of a local layout diagram of another exemplary array substrate consistent with disclosed embodiments of the present disclosure.

Referring to FIG. 17, the control portion 21 may be electrically connected to the fixed voltage terminal connected to the power signal line PVDD. Specifically, the array substrate 100 may further include a first connection portion 31, and the control portion 21 may be connected to the power signal line PVDD through the first connection portion 31. Through configuring the control portion 21 to be directly connected to the power signal line PVDD through the first connection portion 31, the control portion 21 may be connected to the fixed voltage terminal through the power signal line PVDD. In view of this, the control portion 21 may be electrically connected to the fixed voltage terminal without providing additional signal wiring, which may simplify the structure of the array substrate.

In certain embodiments, the first connection portion 31 and the power signal line PVDD may be made of a same material and formed in a same film layer. In view of this, the first connection portion 31 and the power signal line PVDD may be simultaneously formed in a same process step. In one embodiment, referring to FIG. 5, both the first connection portion 31 and the power signal line PVDD may be disposed in the source-drain metal layer M2.

In one embodiment, the control portion 21 and the second semiconductor portion 12 may form the switch element. The second semiconductor portion 12 may be disposed in the semiconductor layer b, and the control portion 21 may be disposed in the gate metal layer M1. It should be understood that if the first connection portion 31 is disposed in the source-drain metal layer M2 and the control portion 21 is disposed in the gate metal layer M1, the first connection portion 31 may be connected to the control portion 21 through a via.

Figure 18:
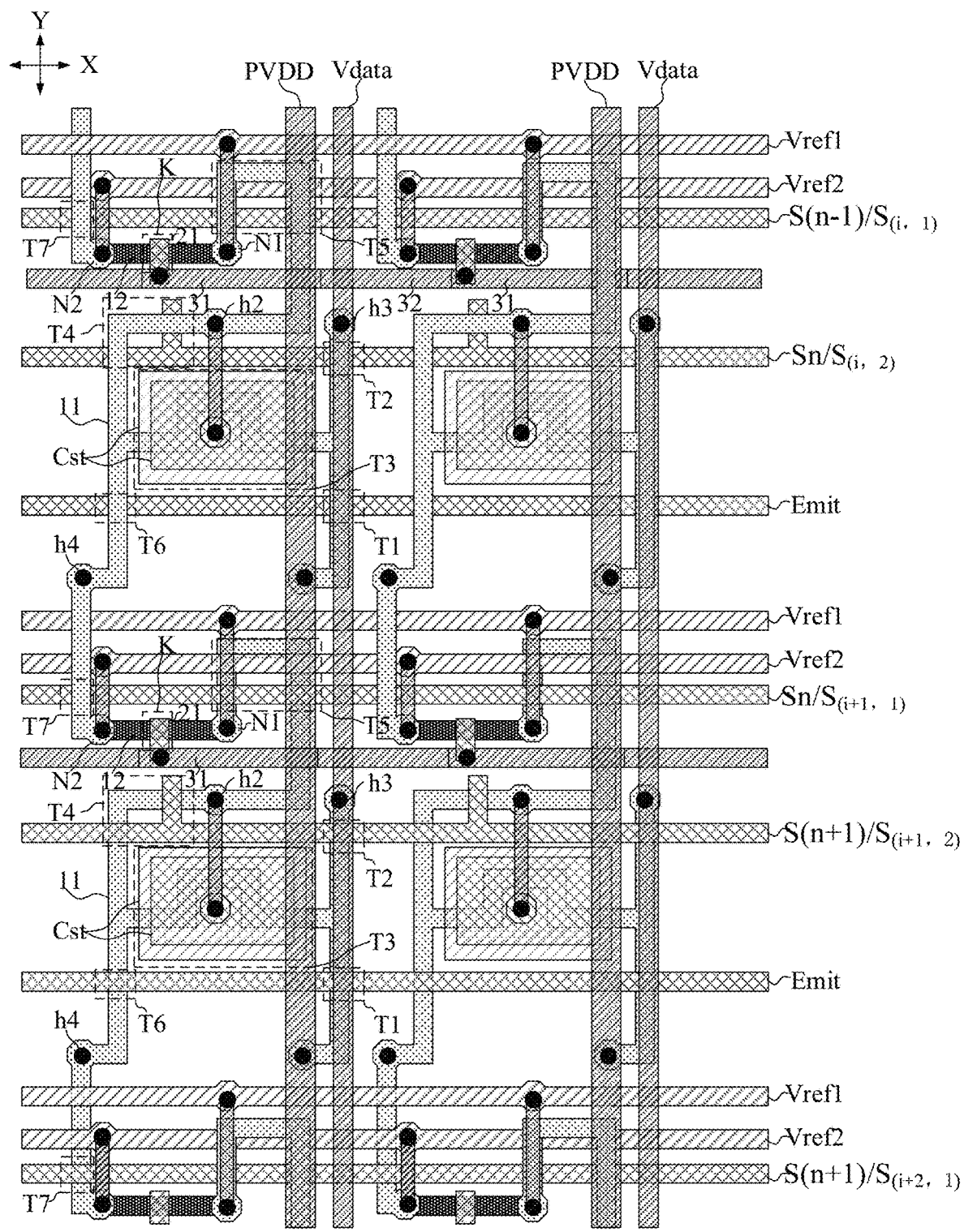
FIG. 18 illustrates a schematic top view of a local layout diagram of another exemplary array substrate consistent with disclosed embodiments of the present disclosure.

In certain embodiments, referring to FIG. 18, the array substrate 100 may further include a second connection portion 32, and the adjacent first connection portions 31 in the first direction X may be connected to each other through the second connection portion 32.

The first connection portion 31 and the second connection portion 32 corresponding to a same row of pixel circuits may form a continuous wiring extended in the first direction X. The first connection portion 31 may be connected to the power signal line PVDD, and the power signal line PVDD may be extended in the second direction Y, which may be equivalent to form a grid-shaped power signal line PVDD and may reduce the voltage drop (IR drop) of the power signal line PVDD.

For example, referring to FIG. 5, the first connection portion 31, the power signal line PVDD, and the data signal line Vdata may be disposed in the source-drain metal layer M2. The second connection portion 32 may overlap the data signal line Vdata, the second connection portion 32 may be disposed in the capacitor metal layer MC, and the second connection portion 32 may be connected to the first connection portion 31 through a via.

In another embodiment, both the power signal line PVDD and the data signal line Vdata may be disposed in the source-drain metal layer M2, the first connection portion 31 and the second connection portion 32 may be disposed in the capacitor metal layer MC, and the first connection portion 31 may be connected to the power signal line PVDD through a via.

Figure 19:
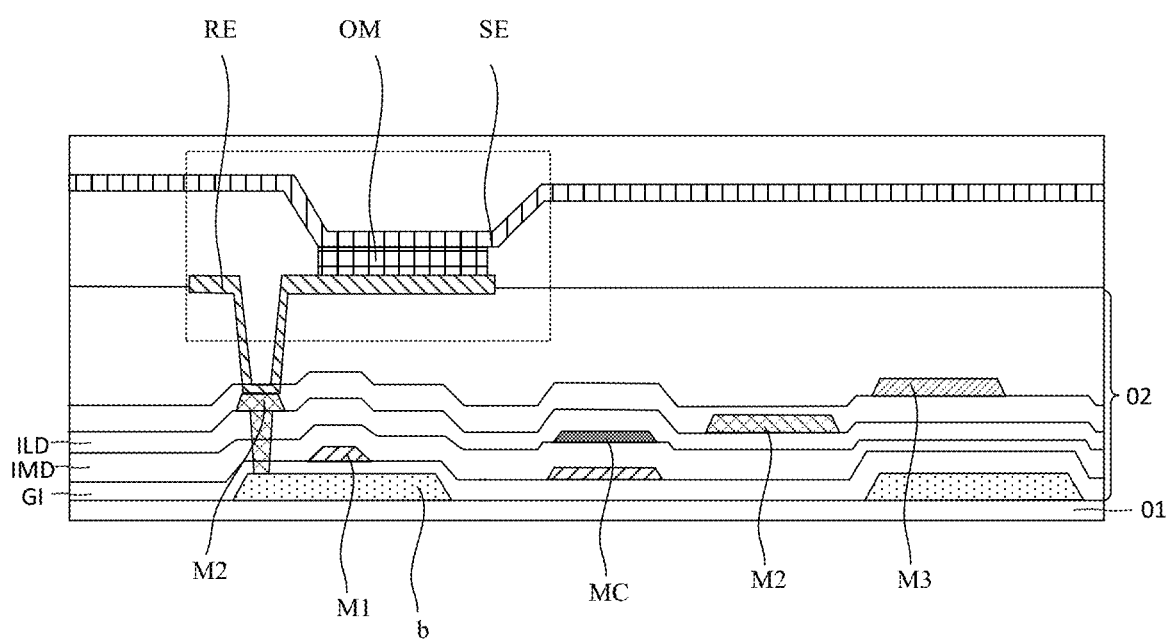
FIG. 19 illustrates a schematic cross-sectional view of another exemplary array substrate consistent with disclosed embodiments of the present disclosure.

In another embodiment, referring to FIG. 19, the driving circuit layer 02 of the array substrate may further include a wiring metal layer M3. The wiring metal layer M3 may be disposed on the side of the source-drain metal layer M2 facing away from the substrate 01, and an insulating layer may be disposed between the wiring metal layer M3 and the source-drain metal layer M2. The power signal line PVDD, the first connection portion 31 and the second connection portion 32 may be disposed in the source-drain metal layer M2, and the data signal line Vdata may be disposed in the wiring metal layer M3.

Figure 20:
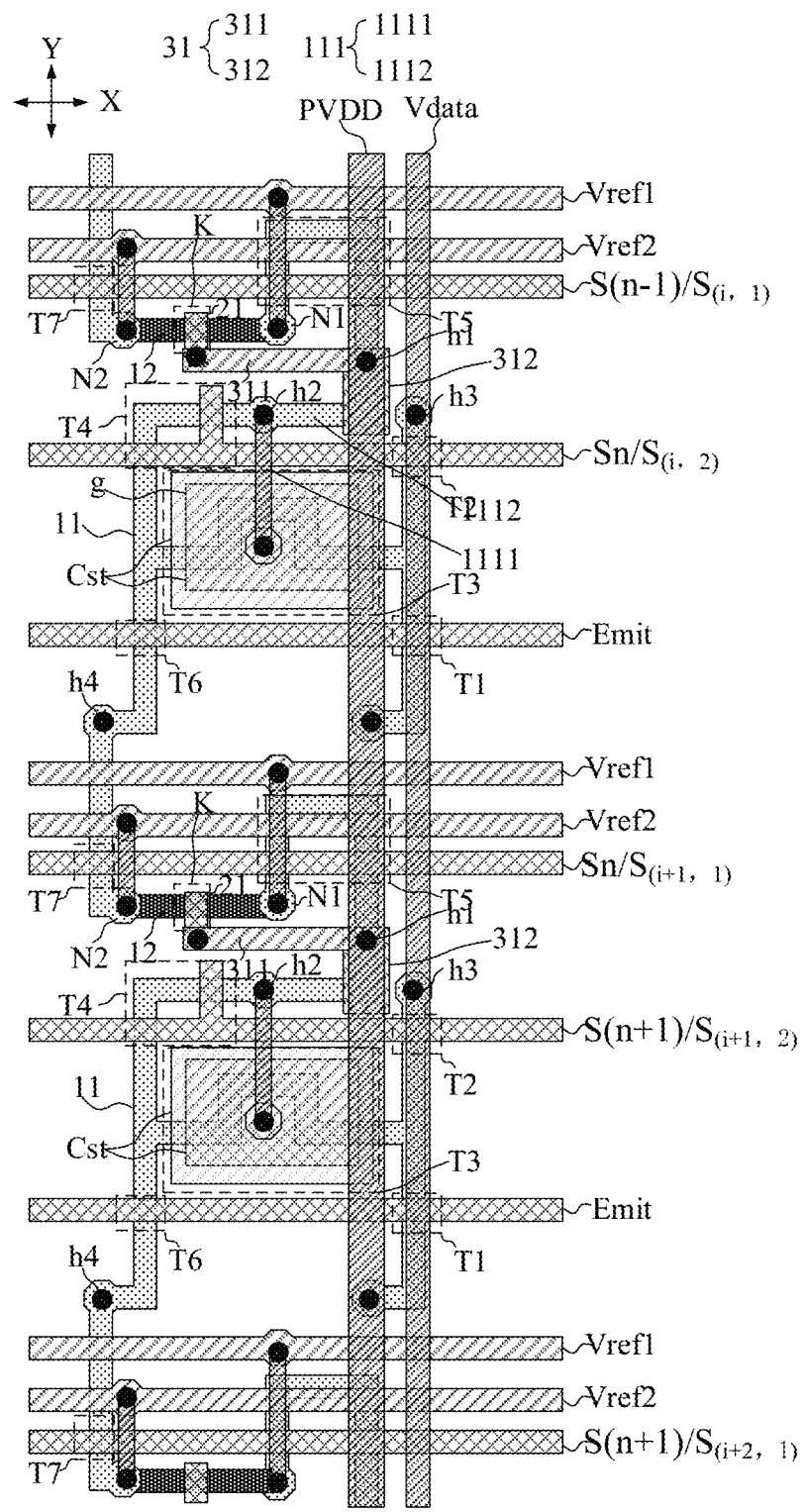
FIG. 20 illustrates a schematic top view of a local layout diagram of another exemplary array substrate consistent with disclosed embodiments of the present disclosure.

In certain embodiments, referring to FIG. 20, the first connection portion 31 may include a connection body portion 311 and a connection branch portion 312, and the connection body portion 311 may be connected to the power signal line PVDD through a first via h1.

The pixel circuit may include the driving transistor T3, the gate initialization transistor T5, and the data-writing transistor T2. The array substrate 100 may further include a gate connection portion 111 and the data signal line Vdata. The gate initialization transistor T5 may be electrically connected to the gate portion g of the driving transistor T3 through the gate connection portion 111. The gate connection portion 111 may include a metal connection portion 1111 and a fourth semiconductor connection portion 1112 that are connected through a second via h2. The drain of the gate initialization transistor T5 may be electrically connected to the gate portion g of the driving transistor T3. The fourth semiconductor connection portion 1112 may be understood as the drain of the gate initialization transistor T5. It should be understood that the fourth semiconductor connection portion 1112 may be a partial region of the first semiconductor portion 11.

The data signal line Vdata may be connected to the data-writing transistor T2 through a third via h3. The data signal line Vdata may be electrically connected to the source of the data-writing transistor T2, and a partial region of the first semiconductor portion 11 may be the source of the data-writing transistor T2.

An orthographic projection of the connection branch portion 312 on the plane of the array substrate 100 may be disposed between the orthographic projections of the second via h2 and the third via h3 on the plane of the array substrate 100. It should be understood that the potential on the connection branch portion 312 may be the same as the potential on the power signal line PVDD, and both may be a fixed potential. Because the connection branch portion 312 is disposed between the second via h2 and the third via h3, the connection branch portion 312 may form an isolation structure between the second via h2 and the third via h3 in the second direction Y, to isolate the signal coupling between the second via h2 and the third via h3.

In certain embodiments, referring to FIG. 5, the connection body portion 311 and the connection branch portion 312 may be disposed in the capacitor metal layer MC, and the power signal line PVDD may be disposed in the source-drain metal layer M2. The data signal line Vdata may be disposed in the source-drain metal layer M2, or referring to FIG. 19, the data signal line Vdata may be disposed in the wiring metal layer M3.

By disposing the connection body portion 311 and the connection branch portion 312 in the capacitor metal layer MC, while isolating the signal coupling between the second via h2 and the third via h3 through the connection branch portion 312, a transistor may be prevented from being formed between each of the connection body portion 311 and the connection branch portion 312 and the first semiconductor portion 11, which may avoid damaging the structure of the pixel circuit.

In certain embodiments, the control portion 21 may be electrically connected to any other fixed voltage terminal in addition to the fixed voltage terminal connected to the power signal line PVDD. Specifically, referring to FIG. 21 or FIG. 22, the array substrate may further include a third connection portion 33. The third connection portion 33 may be extended along the first direction X, and adjacent control portions 21 in the first direction X may be connected to each other through the third connection portion 33. Alternatively, the third connection portion 33 may be extended along the second direction Y, and adjacent control portions 21 in the second direction Y may be connected to each other through the third connection portion 33. The control portion 21 may be connected to the fixed voltage terminal through the third connection portion 33. In one embodiment, for illustrative purposes, the switch element formed by the control portion 21 and the first semiconductor portion 11 may be a P-type transistor as an example. The control portion 21 may be electrically connected to the fixed voltage terminal connected to the high-level signal line (VGH) through the third connection portion 33. The potential of the fixed voltage terminal connected to the high-level signal line (VGH) may be approximately 7V or 8V, which may avoid a case where the switch element formed by the control portion 21 and the first semiconductor portion 11 is not strictly turned off.

In addition, the control portion 21 and the first semiconductor portion 11 may form a switch element, such that the control portion 21 may be disposed in the gate metal layer M1. Regardless of whether the third connection portion 33 is extended in the first direction X or the second direction Y, the third connection portion 33 may overlap the first semiconductor portion 11, and the third connection portion 33 may be formed in a layer different from the control portion 21. In other words, the third connection portion 33 may be disposed in any other film layer other than the gate metal layer M1. Therefore, a transistor may be prevented from being formed between the third connection portion 33 and the first semiconductor portion 11, which may avoid causing unnecessary damages to the structure of the pixel circuit.

Figure 21:
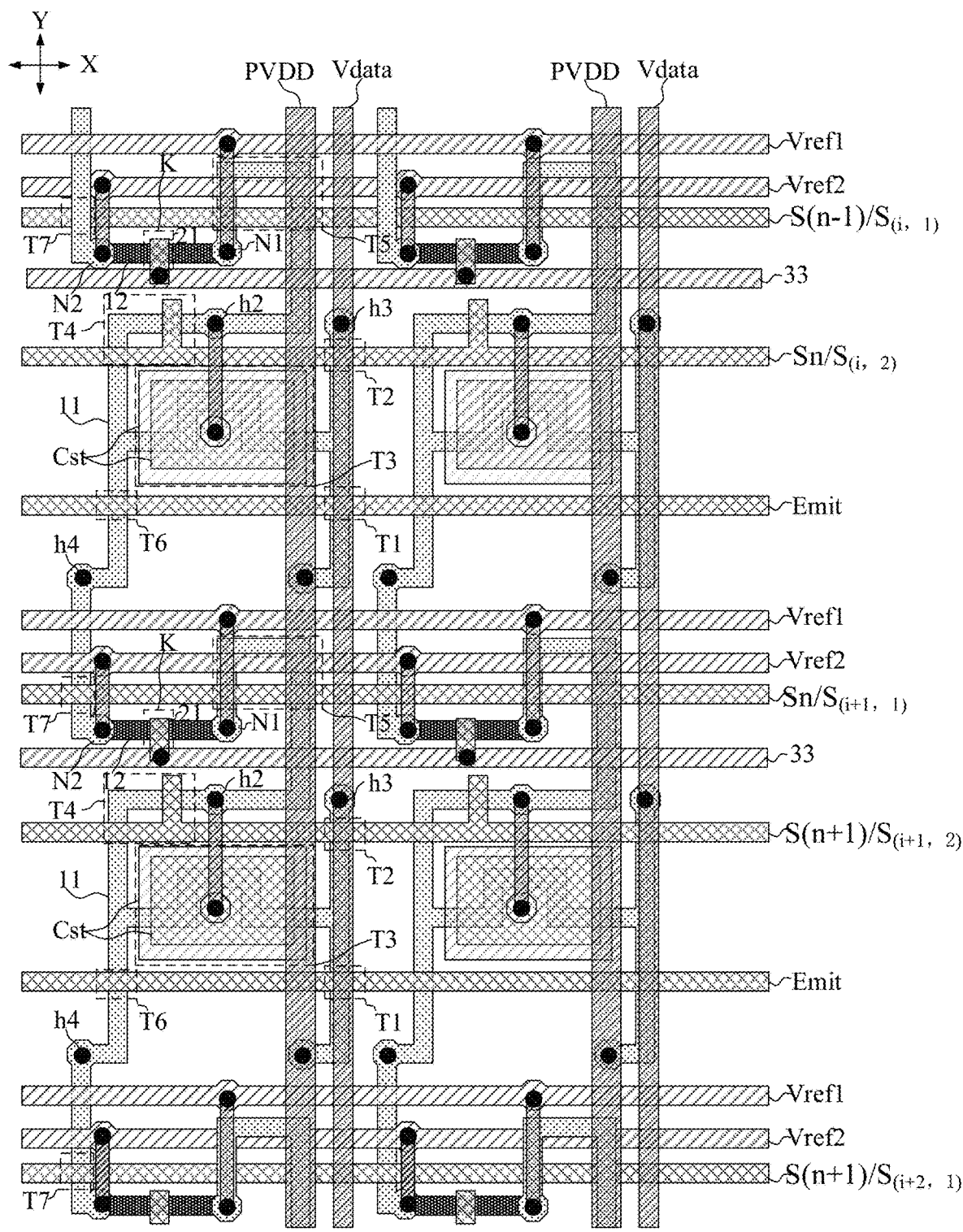
FIG. 21 illustrates a schematic top view of a local layout diagram of another exemplary array substrate consistent with disclosed embodiments of the present disclosure.

In certain embodiments, referring to FIG. 21, the third connection portion 33 may be extended along the first direction X, and the third connection portion 33 may be disposed in the capacitor metal layer MC. The first reference signal line Vref1 and the second reference signal line Vref2 may be disposed in the capacitor metal layer MC, the power signal line PVDD may be disposed in the source-drain metal layer M2, and the data signal line Vdata may be disposed in the source-drain metal layer M2 or the wiring metal layer M3.

Figure 22:
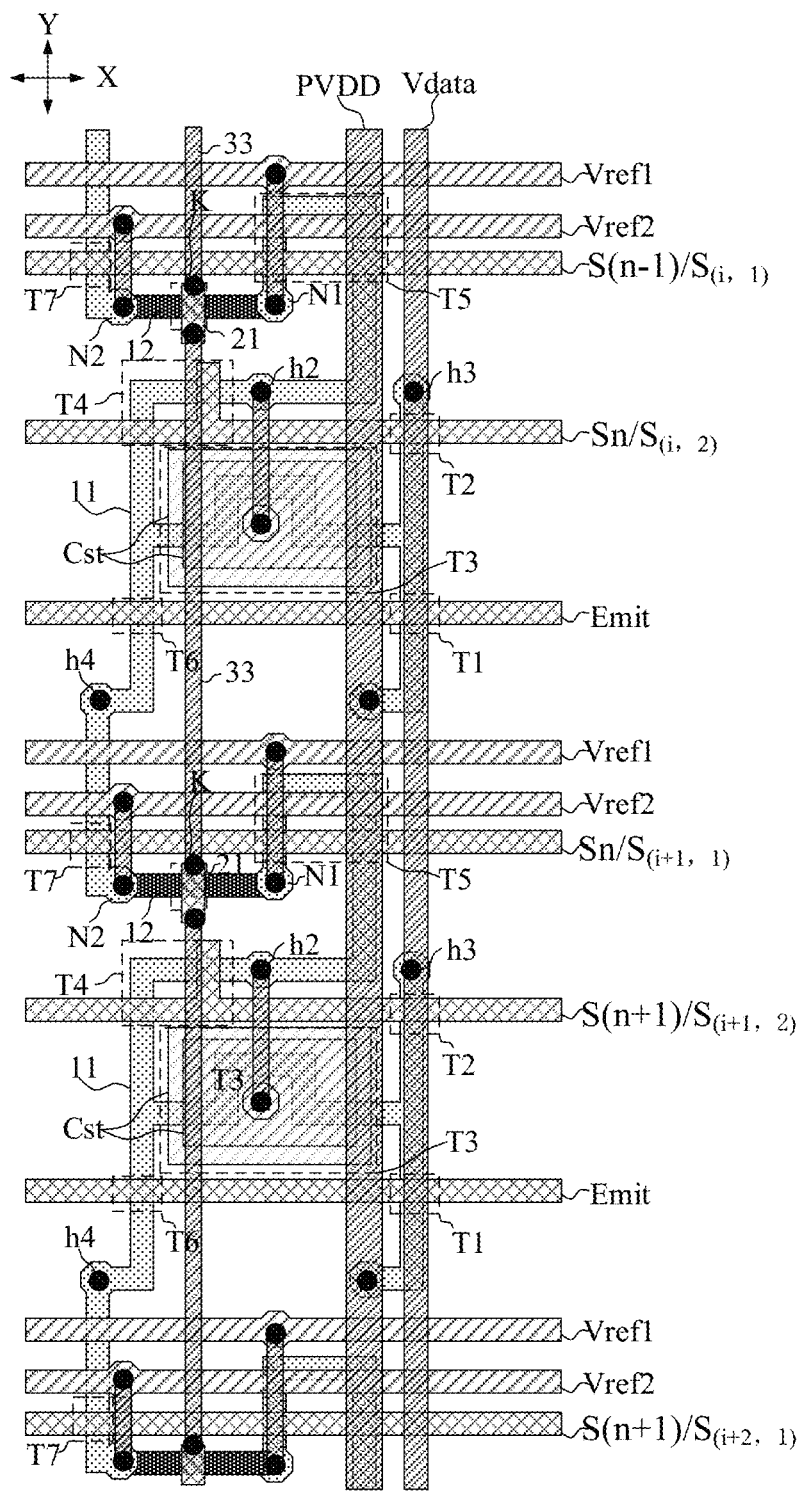
FIG. 22 illustrates a schematic top view of a local layout diagram of another exemplary array substrate consistent with disclosed embodiments of the present disclosure.

In certain embodiments, referring to FIG. 22, the third connection portion 33 may be extended along the second direction Y, and the extension direction of the third connection portion 33 may be the same as the extension directions of the power signal line PVDD and the data signal line Vdata. Therefore, the third connection portion 33 may be formed in a same layer and made of a same material as any one of the power signal line PVDD and the data signal line Vdata. In one embodiment, the third connection portion 33, the power signal line PVDD, and the data signal line Vdata may be disposed in the source-drain metal layer M2. In another embodiment, the power signal line PVDD may be disposed in the source-drain metal layer M2, the data signal line Vdata may be disposed in the wiring metal layer M3, and the third connection portion 33 may be disposed in the source-drain metal layer M2 or the wiring metal layer M3.

In one embodiment, in the present application, the drain of the light-emitting control transistor T6 and the drain of the anode initialization transistor T7 may be electrically connected to the anode of the light-emitting element through a fourth via h4. A partial region of the first semiconductor portion 11 may be the drain of the light-emitting control transistor T6 and the drain of the anode initialization transistor T7.

Figure 23:
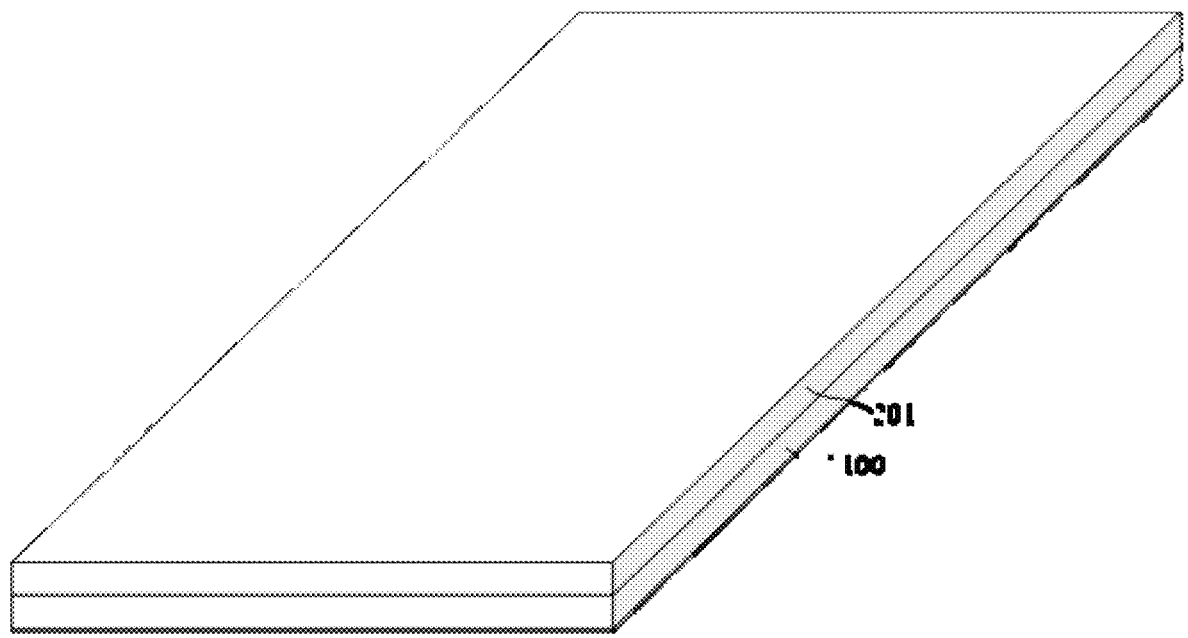
FIG. 23 illustrates a schematic diagram of an exemplary display panel consistent with disclosed embodiments of the present disclosure.

The present disclosure also provides a display panel, and the display panel may include the array substrate in any one of the above-disclosed embodiments. FIG. 23 illustrates a schematic diagram of a display panel consistent with disclosed embodiments of the present disclosure. Referring to FIG. 23, the display panel 200 may include the array substrate 100 in any one of the above-disclosed embodiments and the light-emitting layer 201 on the array substrate 100. In one embodiment, the light-emitting layer 201 may be an organic light-emitting layer. In other words, the display panel 200 may be an organic light-emitting diode (OLED) display panel. In certain embodiments, the display panel may be any other type of display panels, which may not be limited by the present disclosure.

Figure 24:
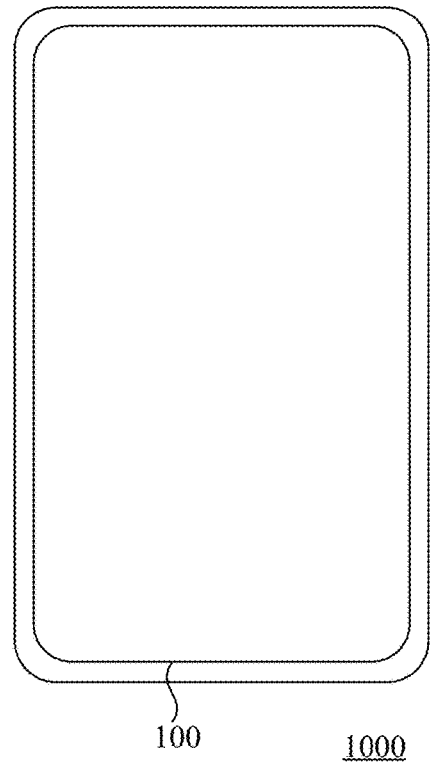
FIG. 24 illustrates a schematic diagram of an exemplary display device consistent with disclosed embodiments of the present disclosure.

The present disclosure also provides a display device, and the display device may include the array substrate in any one of the above-disclosed embodiments. FIG. 24 illustrates a schematic diagram of a display device consistent with disclosed embodiments of the present disclosure. Referring to FIG. 24, the display device 1000 may include the array substrate 100 in any one of the above-disclosed embodiments. For illustrative purposes, FIG. 24 merely illustrates a mobile phone as an example for the description of the display device 1000. It should be understood that the display device may be a wearable product, a computer, a television, a vehicle display device, or any other display device with a display function, which may not be limited by the present disclosure. The display device may have the beneficial effects of the array substrate provided in the disclosed embodiments of the present disclosure, which may refer to the description of the array substrate in the above-disclosed embodiments, and may not be repeated herein.

Accordingly, the present disclosure provides an array substrate, a display panel and a display device. On the one hand, the first semiconductor portions 11 of the adjacent pixel circuits 10 in the second direction Y may be connected to each other through the second semiconductor portion 12, such that the first semiconductor portion 11 of each pixel circuit 10 may no longer be isolated. The adjacent first semiconductor portion 11 and the second semiconductor portion 12 in the second direction Y may be understood as forming a continuous semiconductor wire, such that static electricity may be evenly distributed on the continuous semiconductor wire. Furthermore, the reliability and uniformity of the performance of the first semiconductor portion 11 in the subsequent high-temperature manufacturing process may be improved, such that the driving capabilities of the pixel circuits may be basically the same, thereby achieving the display uniformity and improving the display effect. On the other hand, although the adjacent first semiconductor portions 11 are physically connected to each other through the second semiconductor portion 12, the control portion 21 and the second semiconductor portion 12 may form the switch element K, and the switch element K may cut off the electrically connection between the first node N1 and the second node N2. Therefore, the first node N1 and the second node N2 may not be shorted, and thus may not affect the display of the light-emitting element driven by each pixel circuit The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. An array substrate, comprising:
a plurality of pixel circuits arranged in an array in a first direction and a second direction that intersect each other, wherein each pixel circuit of the plurality of pixel circuits includes a first semiconductor portion, and the first semiconductor portion includes a first node and a second node;
a first reference signal line, extended along the first direction and electrically connected to the first node;
a second reference signal line, extended along the first direction and electrically connected to the second node;
a second semiconductor portion, wherein in adjacent two pixel circuits in the second direction of the plurality of pixel circuits, the first node of one pixel circuit is connected to the second node of the other one pixel circuit through the second semiconductor portion; and
a control portion, wherein an orthographic projection of the control portion on a plane of the array substrate at least partially overlaps an orthographic projection of the second semiconductor portion on the plane of the array substrate, and the control portion and the second semiconductor portion form a switch element.

2. The array substrate according to claim 1, further including:
a function region, wherein multiple pixel circuits of the plurality of pixel circuits are disposed on both sides of the function region in the second direction; and
a third semiconductor portion, extended around the function region, wherein first semiconductor portions and second semiconductor portions disposed on both sides of the function region in the second direction are connected with each other through the third semiconductor portion.

3. The array substrate according to claim 1, wherein:
the control portion includes a first control portion and a second control portion, wherein:
an orthographic projection of each of the first control portion and the second control portion on the plane of the array substrate at least partially overlaps the orthographic projection of the second semiconductor portion on the plane of the array substrate, and
the orthographic projections of the first control portion and the second control portion on the plane of the array substrate do not overlap.

4. The array substrate according to claim 3, further including:
a first scanning signal line, extended along the first direction and electrically connected to a pixel circuit of the plurality of circuits, wherein the first scanning signal line includes a first branch portion, and the first branch portion is multiplexed as the first control portion; and a second scanning signal line, extended along the first direction and electrically connected to a pixel circuit of the plurality of circuits, wherein the second scanning signal line includes a second branch portion, and the second branch portion is multiplexed as the second control portion.

5. The array substrate according to claim 4, wherein:
the pixel circuit includes a compensation transistor, and the compensation transistor is a double-gate transistor, wherein the second branch portion is multiplexed as a gate of the compensation transistor.

6. The array substrate according to claim 5, wherein:
the first branch portion is located on a side of the second branch portion away from the first node in the first direction.

7. The array substrate according to claim 1, wherein:
the control portion is electrically connected to a fixed voltage terminal, and the switch element is kept at off-state.

8. The array substrate according to claim 7, further including:
a first connection portion and a power signal line, wherein the control portion is connected to the power signal line through the first connection portion.

9. The array substrate according to claim 8, further including:
a second connection portion, wherein adjacent first connection portions in the first direction are connected to each other through the second connection portion.

10. The array substrate according to claim 8, wherein:
the first connection portion and the power signal line are formed in a same layer and made of a same material.

11. The array substrate according to claim 8, wherein:
the first connection portion includes a connection body portion and a connection branch portion, wherein the connection body portion is connected to the power signal line through a first via;
the pixel circuit includes a driving transistor, a gate initialization transistor, and a data-writing transistor, and the array substrate further includes a gate connection portion and a data signal line, wherein the gate initialization transistor is electrically connected to a gate portion of the driving transistor through the gate connection portion, the gate connection portion includes a metal connection portion and a fourth semiconductor connection portion that are connected through a second via, and the data signal line is connected to the data-writing transistor through a third via; and
an orthographic projection of the connection branch portion on the plane of the array substrate is disposed between orthographic projections of the second via and the third via on the plane of the array substrate.

12. The array substrate according to claim 11, further including:
a substrate and a driving circuit layer disposed over the substrate, wherein:
the driving circuit layer includes a gate metal layer, a capacitor metal layer, and a source-drain metal layer that are sequentially stacked in a direction away from the substrate, and
the connection body portion and the connection branch portion are disposed in the capacitor metal layer, and the power signal line is disposed in the source-drain metal layer.

13. The array substrate according to claim 7, further including:

a substrate and a driving circuit layer disposed over the substrate, wherein the driving circuit layer includes a gate metal layer, a capacitor metal layer, and a source-drain metal layer that are sequentially stacked in a direction away from the substrate, and a third connection portion, wherein adjacent control portions in the first direction are connected to each other through the third connection portion, or adjacent control portions in the second direction are connected to each other through the third connection portion, the control portion is connected to the fixed voltage terminal through the third connection portion, and the third connection portion is disposed in a layer different from the control portion.

14. The array substrate according to claim 13, wherein:
the third connection portion is extended along the first direction and is disposed in the capacitor metal layer; or
the third connection portion is extended along the second direction, wherein the array substrate further includes a power signal line and a data signal line extended along the second direction, and the third connection portion is formed in a same layer and made of a same material as any one of the power signal line and the data signal line.

15. The array substrate according to claim 2, wherein:
the first semiconductor portion, the second semiconductor portion, and the third semiconductor portion are made of a same material and formed in a same film layer.

16. A display panel, comprising:
an array substrate, the array substrate including:
a plurality of pixel circuits arranged in an array in a first direction and a second direction that intersect each other, wherein each pixel circuit of the plurality of pixel circuits includes a first semiconductor portion, and the first semiconductor portion includes a first node and a second node;
a first reference signal line, extended along the first direction and electrically connected to the first node;
a second reference signal line, extended along the first direction and electrically connected to the second node;
a second semiconductor portion, wherein in adjacent two pixel circuits in the second direction of the plurality of pixel circuits, the first node of one pixel circuit is connected to the second node of the other one pixel circuit through the second semiconductor portion; and
a control portion, wherein an orthographic projection of the control portion on a plane of the array substrate at least partially overlaps an orthographic projection of the second semiconductor portion on the plane of the array substrate, and the control portion and the second semiconductor portion form a switch element.

17. A display device, comprising:
a display panel including an array substrate, the array substrate including:
a plurality of pixel circuits arranged in an array in a first direction and a second direction that intersect each other, wherein each pixel circuit of the plurality of pixel circuits includes a first semiconductor portion, and the first semiconductor portion includes a first node and a second node;
a first reference signal line, extended along the first direction and electrically connected to the first node;
a second reference signal line, extended along the first direction and electrically connected to the second node;
a second semiconductor portion, wherein in adjacent two pixel circuits in the second direction of the plurality of pixel circuits, the first node of one pixel circuit is connected to the second node of the other one pixel circuit through the second semiconductor portion; and
a control portion, wherein an orthographic projection of the control portion on a plane of the array substrate at least partially overlaps an orthographic projection of the second semiconductor portion on the plane of the array substrate, and the control portion and the second semiconductor portion form a switch element.

18. The display device according to claim 17, wherein the array substrate further includes:
a function region, wherein multiple pixel circuits of the plurality of pixel circuits are disposed on both sides of the function region in the second direction; and
a third semiconductor portion, extended around the function region, wherein first semiconductor portions and second semiconductor portions disposed on both sides of the function region in the second direction are connected with each other through the third semiconductor portion.

19. The display device according to claim 17, wherein:
the control portion includes a first control portion and a second control portion, wherein:
an orthographic projection of each of the first control portion and the second control portion on the plane of the array substrate at least partially overlaps the orthographic projection of the second semiconductor portion on the plane of the array substrate, and
the orthographic projections of the first control portion and the second control portion on the plane of the array substrate do not overlap.

20. The display device according to claim 19, wherein the array substrate further includes:
a first scanning signal line, extended along the first direction and electrically connected to a pixel circuit of the plurality of circuits, wherein the first scanning signal line includes a first branch portion, and the first branch portion is multiplexed as the first control portion; and
a second scanning signal line, extended along the first direction and electrically connected to a pixel circuit of the plurality of circuits, wherein the second scanning signal line includes a second branch portion, and the second branch portion is multiplexed as the second control portion.

* * * * *